(12) United States Patent
Baek

(10) Patent No.: US 12,322,687 B2
(45) Date of Patent: Jun. 3, 2025

(54) SUBSTRATE FOR NOISE PREVENTION AND SEMICONDUCTOR PACKAGE INCLUDING THE SUBSTRATE

(71) Applicant: SAMSUNG ELECTRONICS CO., LTD., Suwon-si (KR)

(72) Inventor: Kiwon Baek, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 796 days.

(21) Appl. No.: 17/589,285

(22) Filed: Jan. 31, 2022

(65) Prior Publication Data

US 2022/0392833 A1 Dec. 8, 2022

(30) Foreign Application Priority Data

Jun. 8, 2021 (KR) .................. 10-2021-0074296

(51) Int. Cl.
*H01L 23/498* (2006.01)
*H01L 23/31* (2006.01)

(52) U.S. Cl.
CPC .... *H01L 23/49822* (2013.01); *H01L 23/3107* (2013.01); *H01L 23/49838* (2013.01)

(58) Field of Classification Search
None
See application file for complete search history.

(56) References Cited

U.S. PATENT DOCUMENTS

| | | | |
|---|---|---|---|
| 5,220,210 A | * | 6/1993 | Miwada ............ H01L 27/14825 257/443 |
| 7,851,709 B2 | | 12/2010 | Cheng |
| 9,198,279 B2 | | 11/2015 | Hayashi |
| 9,520,160 B2 | | 12/2016 | Yoon et al. |
| 10,651,525 B2 | | 5/2020 | Elsherbini et al. |
| 2004/0121523 A1 | * | 6/2004 | Nakanishi ............ H10K 59/131 438/128 |
| 2012/0080224 A1 | | 4/2012 | Yoo et al. |
| 2012/0081869 A1 | | 4/2012 | Kim et al. |
| 2019/0348459 A1 | * | 11/2019 | Katkar .................... H01L 24/20 |
| 2021/0099658 A1 | * | 4/2021 | Tokuhara ............ H04N 25/709 |
| 2022/0165724 A1 | * | 5/2022 | Ishimatsu ............ H10D 84/859 |

FOREIGN PATENT DOCUMENTS

KR 10-2009-0114628 A 11/2009

\* cited by examiner

*Primary Examiner* — Bilkis Jahan
(74) *Attorney, Agent, or Firm* — Sughrue Mion, PLLC

(57) ABSTRACT

A substrate is provided. The substrate includes a body layer that includes a signal area; a first wiring layer provided on a lower surface of the body layer, the first wiring layer including a plurality of first signal lines provided in the signal area and a first power line provided outside the signal area; and a second wiring layer provided on an upper surface of the body layer, the second wiring layer including a plurality of second signal lines provided in the signal area and a second power line provided outside the signal area.

20 Claims, 25 Drawing Sheets

SUBSTRATE FOR NOISE PREVENTION AND SEMICONDUCTOR PACKAGE INCLUDING THE SUBSTRATE

CROSS-REFERENCE TO RELATED APPLICATION

This application claims priority to Korean Patent Application No. 10-2021-0074296, filed on Jun. 8, 2021, in the Korean Intellectual Property Office, the disclosure of which is incorporated by reference herein in its entirety.

BACKGROUND

The present disclosure relates to a semiconductor package, and more particularly, to a substrate for noise prevention and a semiconductor package including the substrate.

As the electronics industry advances, electronic devices are increasingly miniaturized with reduced weight, while users demand increased performance, capacity, and reliability. As semiconductor packages are miniaturized and the operating speed thereof is increased, noise may affect signal integrity. Accordingly, research and development on a package structure with high signal integrity are continuously being conducted.

SUMMARY

One or more example embodiments provide a substrate for noise prevention, which may improve signal integrity, and a semiconductor package including the substrate.

Additional aspects will be set forth in part in the description which follows and, in part, will be apparent from the description, or may be learned by practice of the presented embodiments.

According to an aspect of an example embodiment, there is provided a substrate including: a body layer with a signal area; a first wiring layer provided on a lower surface of the body layer, the first wiring layer including a plurality of first signal lines provided in the signal area and a first power line provided outside the signal area; and a second wiring layer provided on an upper surface of the body layer, the second wiring layer including a plurality of second signal lines provided in the signal area and a second power line provided outside the signal area.

According to an aspect of an example embodiment, there is provided a substrate including: a body layer including a signal area; a first wiring layer provided on a lower surface of the body layer, the first wiring layer including a plurality of first signal lines provided in the signal area and a first power line provided outside the signal area; a second wiring layer provided on an upper surface of the body layer, the second wiring layer including a plurality of second signal lines provided in the signal area and a second power line provided outside the signal area; and an internal wiring layer provided inside the body layer between the first wiring layer and the second wiring layer. A group of signal lines from among the plurality of first signal lines and the plurality of second signal lines having substantially a same operating speed and function form a signal group, and the signal area corresponds to an area including outermost signal lines among the plurality of first signal lines and the plurality of second signal lines forming the signal group in a horizontal direction parallel to the upper surface and a vertical direction perpendicular to the upper surface.

According to an aspect of an example embodiment, there is provided a semiconductor package including: a substrate with: a body layer including a signal area; a first wiring layer provided on a lower surface of the body layer, the first wiring layer including a plurality of first signal lines provided in the signal area and a first power line provided outside the signal area; and a second wiring layer provided on an upper surface of the body layer, the second wiring layer including a plurality of second signal lines provided in the signal area and a second power line provided outside the signal area; at least one semiconductor chip mounted on the substrate; and a sealing member sealing the at least one semiconductor chip on the substrate.

BRIEF DESCRIPTION OF THE DRAWINGS

The above and other aspects, features, and advantages will be more clearly understood from the following detailed description, taken in conjunction with the accompanying drawings, in which.

DETAILED DESCRIPTION

Figure 1A:
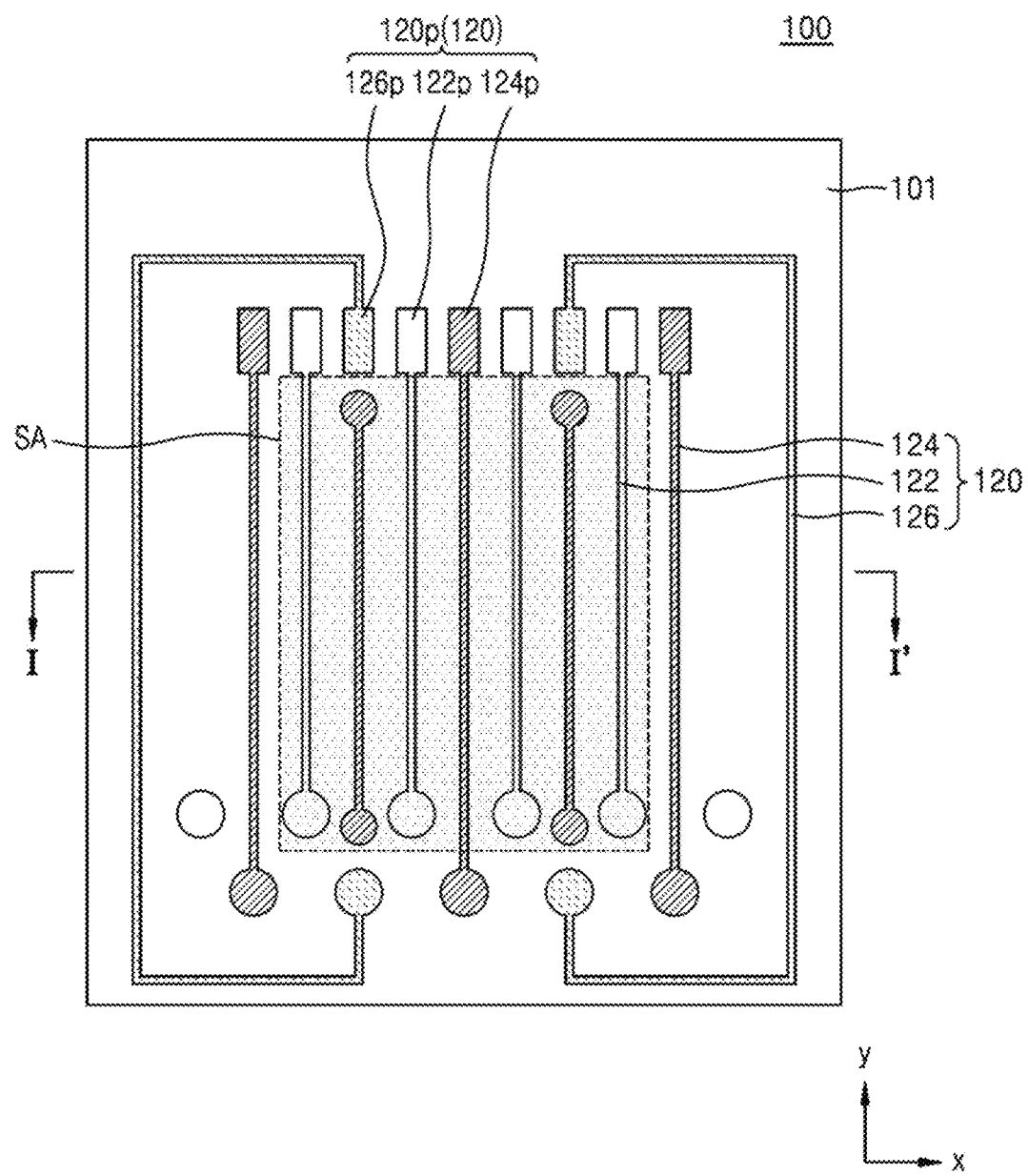
FIGS. 1A and 1B are respectively a plan view and a cross-sectional view of a substrate for noise prevention, according to an example embodiment.

Hereinafter, example embodiments will be described in detail with reference to the accompanying drawings. Like components are denoted by like reference numerals throughout the specification, and repeated descriptions thereof are omitted.

Figure 1B:
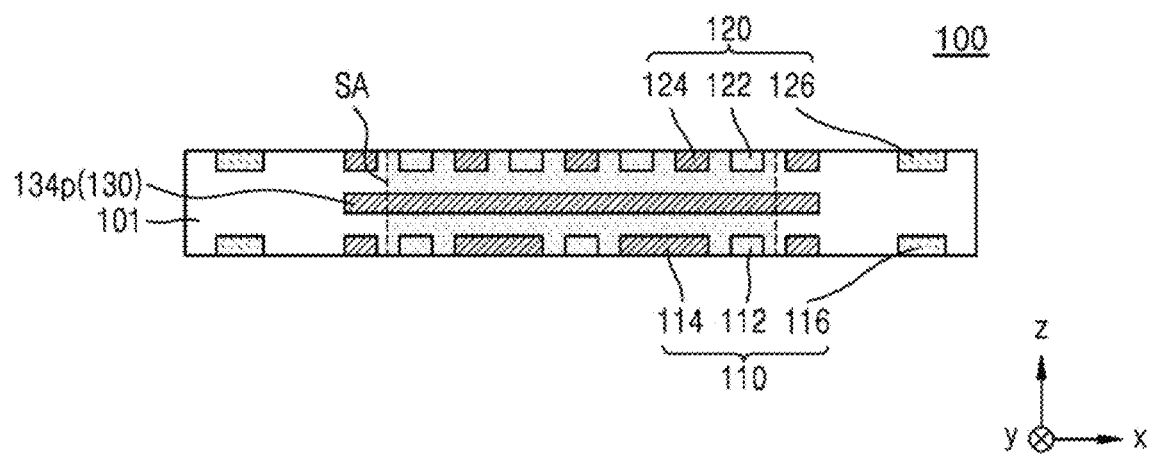

FIGS. 1A and 1B are respectively a plan view and a cross-sectional view of a substrate for noise prevention, according to an example embodiment, wherein FIG. 1B is a cross-sectional view taken along a section I-I' of FIG. 1A.

Referring to FIGS. 1A and 1B, a substrate for noise prevention 100 (hereinafter, simply referred to as a 'substrate') according to an example embodiment may include a body layer 101, a lower wiring layer 110, an upper wiring layer 120, and an internal wiring layer 130.

The body layer 101 may include various materials. For example, according to the type of the substrate 100, the body layer 101 may include silicon, ceramic, an organic material, glass, an epoxy resin, or the like. The substrate 100 of an example embodiment may be a printed circuit board (PCB), and the body layer 101 may be formed based on an epoxy resin. Various wiring layers may be formed on the body layer 101. In the substrate 100 of an example embodiment, three wiring layers, i.e., the lower wiring layer 110, the upper wiring layer 120, and the internal wiring layer 130, may be formed. However, the number of wiring layers is not limited to three.

Protective layers (refer to 103*u* and 103*l* of FIG. 8A) may be formed on a lower surface and an upper surface of the body layer 101. The protective layers may cover and protect the lower wiring layer 110 and the upper wiring layer 120. The protective layers may include, for example, a solder resist (SR). However, the material of the protective layers is not limited to SR. For example, according to a type or function of the substrate 100, the protective layers may include a passivation layer, such as an oxide film, a nitride film, or the like. Pins 120*p* of the lower wiring layer 110 and the upper wiring layer 120 may be exposed through the protective layers.

The lower wiring layer 110 may be arranged on the lower surface of the body layer 101. The lower wiring layer 110 may include a lower signal line 112, a lower ground line 114, and a lower power line 116. The lower signal line 112 may be connected between signal pins, the lower ground line 114 may be connected between ground pins, and the lower power line 116 may be connected between power pins. Herein, the pins 120*p* are portions connected to connection terminals such as solder balls or bumps, or vertical contacts, and as shown in FIG. 1, the pins 120*p* are shown as squares, circles, or the like to be distinguished from lines. According to a function or a position, the pins 120*p* may also be referred to as pads.

The upper wiring layer 120 may be arranged on the upper surface of the body layer 101. The upper wiring layer 120 may include an upper signal line 122, an upper ground line 124, and an upper power line 126. The upper signal line 122 may be connected between signal pins 122*p*, the upper ground line 124 may be connected between ground pins 124*p*, and the upper power line 126 may be connected between power pins 126*p*.

The internal wiring layer 130 may be arranged inside the body layer 101. The internal wiring layer 130 may include a ground plane 134*p*. However, the internal wiring layer 130 is not limited to only including the ground plane 134*p*. For example, the internal wiring layer 130 may further include an internal signal line, an internal ground line, an internal power line, or the like. At least one of the ground plane 134*p*, the internal signal line, the internal ground line, and the internal power line may be omitted from the internal wiring layer 130. In addition, according to a cutting position, at least one of the ground plane 134*p*, the internal signal line, the internal ground line, and the internal power line may not be shown in the cross-sectional view.

In FIG. 1B, although the internal wiring layer 130 is illustrated as one layer in the body layer 101, the internal wiring layer 130 is not limited to one layer. For example, the internal wiring layer 130 may be arranged in the body layer 101, and may be a multi-layer that includes two or more layers. According to an example embodiment, the internal wiring layer 130 may also be omitted. A substrate including an internal wiring layer of a multi-layer will be described in more detail below with reference to FIGS. 5C, 6A, 6B and 6C.

For reference, the ground plane 134*p* may indicate a ground wire having a certain area like a flat plate, and compared to a ground line having a line shape, may be primarily provided to prevent noise rather than provide a ground supply. Hereinafter, for convenience of explanation, a ground wire having a width greater than or equal to ½ of a width of a signal area SA in a horizontal direction is referred to as a ground plane, and a ground wire having a width less than that is referred to as a ground line. However, example embodiments are not limited thereto, and the ground plane and the ground line may be defined in various ways. A power wire may have a certain area, and in such a case, the power wire may be referred to as a power plane. Also, with reference to noise prevention, the ground wire and the power wire may be referred to as reference wires.

The lower wiring layer 110, the upper wiring layer 120, and the internal wiring layer 130 may be electrically connected to each other through vertical contacts or the like arranged in the body layer 101. According to an example embodiment, through vias penetrating at least a portion of the body layer 101 may also be arranged in the body layer 101. Herein, the vertical contacts and the through vias may be functionally similar in terms of connecting wires of different layers. However, the vertical contacts and the through vias may differ from each other in size, shape, material, or the like. For example, the through vias may have a relatively large and complex structure compared to the vertical contacts.

In the substrate 100 of an example embodiment, the lower and upper power lines 116 and 126 may be outside (i.e., not included in) the signal area SA. That is, only the lower and upper signal lines 112 and 122, and lower and upper ground lines 114 and 124 may be included in the signal area SA, and the lower and upper power lines 116 and 126 may not be included in the signal area SA. For example, as shown in FIGS. 1A and 1B, the lower and upper signal lines 112 and 122 may connect the signal pins 122*p* by passing through the signal area SA. The lower and upper ground lines 114 and 124 may connect the ground pins 124*p* by passing through the signal area SA. In addition, the lower and upper ground lines 114 and 124 may connect the ground pins 124*p* outside the signal area SA. On the contrary, the lower and upper power lines 116 and 126 connecting the power pins 126*p* are routed around the signal area SA, and do not pass through the signal area SA. In this regard, no power lines are present within a continuous three-dimensional space corresponding to the signal area SA. As described above, noise caused by the lower and upper power lines 116 and 126 may be suppressed by not arranging the lower and upper power lines 116 and 126 in the signal area SA, and thus, signal integrity (SI) in the substrate 100 may be guaranteed.

Herein, the signal area SA may be defined by an area occupied by a signal group. The signal area SA may be a continuous three-dimensional space. The signal group may indicate a group in which the lower and upper signal lines 112 and 122 are divided according to an operating speed and function. For example, the lower and upper signal lines 112 and 122 may include data signal lines DQ which may be divided into one or more signal groups according to an operating speed and function. For example, the data signal lines DQ forming one signal group may have substantially the same operating speed and function. The lower and upper signal lines 112 and 122 may also include command/address signal lines C/A which may also form one signal group. However, according to an example embodiment, the command/address signal lines C/A may not form a signal group. A signal group and the signal area SA will be described in more detail below with reference to FIGS. 4A, 4B, 5A, 5B, 5C, 6A, 6A and 6C.

Figure 2A:
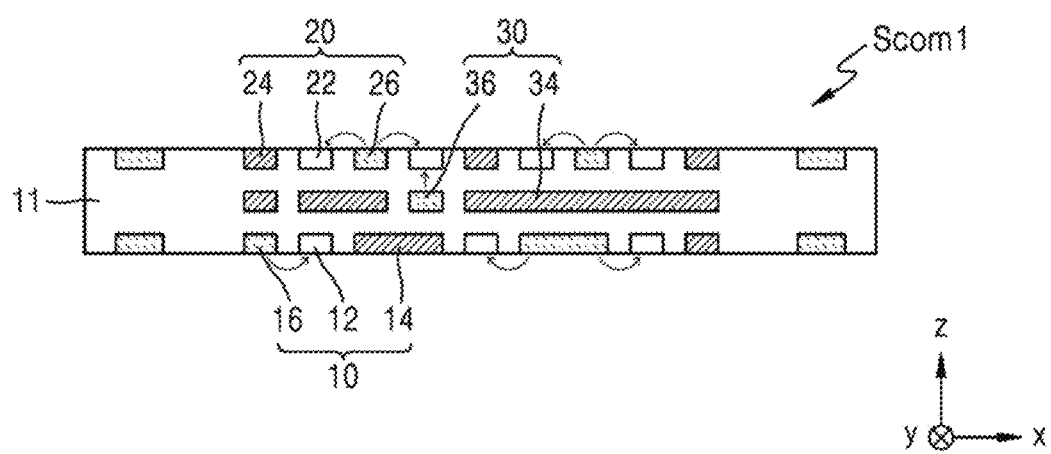
FIG. 2A is a cross-sectional view of a substrate of a comparative example.
Figure 2B:
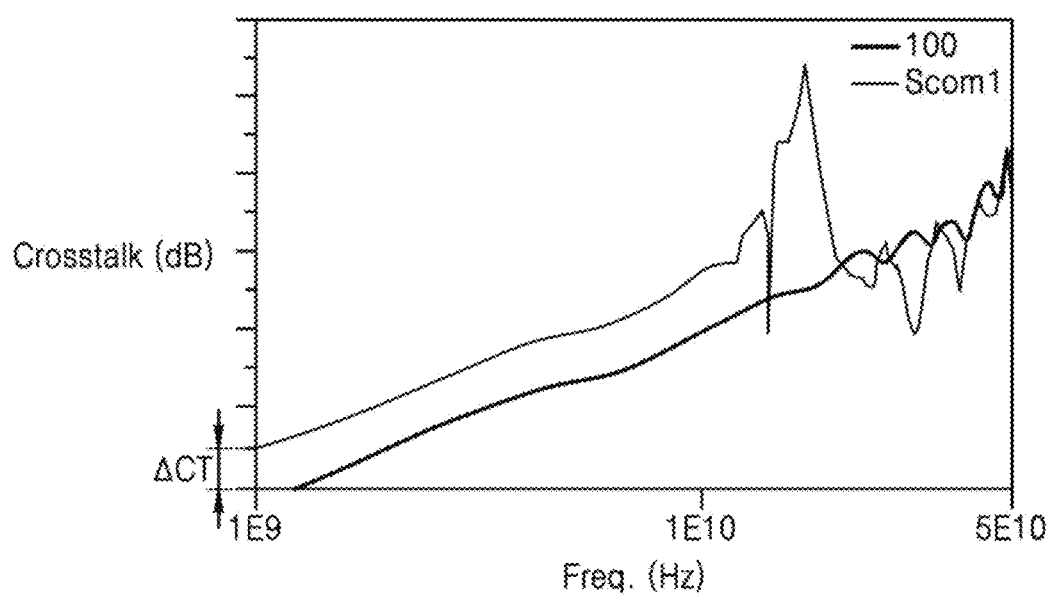
FIG. 2B is a graph showing crosstalk according to frequencies of the substrate of the comparative example of FIG. 2A and the substrate for noise prevention of FIG. 1B.

FIG. 2A is a cross-sectional view of a substrate Scom1 of a comparative example, and FIG. 2B is a graph showing crosstalk according to frequencies of the substrate Scom1 of the comparative example of FIG. 2A and the substrate 100 of FIG. 1B, wherein a thin solid line corresponds to the substrate Scom1 of the comparative example of FIG. 2A, and a thick solid line corresponds to the substrate 100 of FIG. 1B.

Referring to FIG. 2A, the substrate Scom1 of the comparative example may include a body layer 11, a lower wiring layer 10, an upper wiring layer 20, and an internal wiring layer 30. In addition, the lower wiring layer 10, the upper wiring layer 20, and the internal wiring layer 30 may respectively include signal lines 12 and 22, ground lines 14, 24, and 34, and power lines 16, 26, and 36. In the substrate Scom1 of the comparative example, the power lines 16, 26, and 36 may be arranged adjacent to the signal lines 12 and 22 in a first direction (x direction) and a third direction (z direction). Here, the first direction (x direction) may be defined as a direction parallel to the upper surface of the substrate 100, the third direction (z direction) may be defined as a direction perpendicular to the upper surface of the substrate 100, and a second direction (y direction) may be defined as a direction parallel to the upper surface of the substrate 100 and perpendicular to the first direction (x direction).

As the power lines 16, 26, and 36 are arranged adjacent to the signal lines 12 and 22 the substrate Scom1 of the comparative example, the power lines 16, 26, and 36 may interfere and cause noise on the signal lines 12 and 22. In other words, power noise coupling or crosstalk due to power resonance viewed from the signal lines 12 and 22 may increase, and accordingly, SI characteristics may be decreased.

Referring to FIG. 2B, as can be seen from the graph, crosstalk may increase as a frequency increases. In addition, it may be seen that, generally, the substrate Scom1 of the comparative example of FIG. 2A has higher crosstalk by a ΔCT amount than the substrate 100 of FIG. 1B. It may be predicted that a difference in crosstalk by the ΔCT amount is caused by power noise coupling due to the power lines 16, 26, and 36.

Figure 3A:
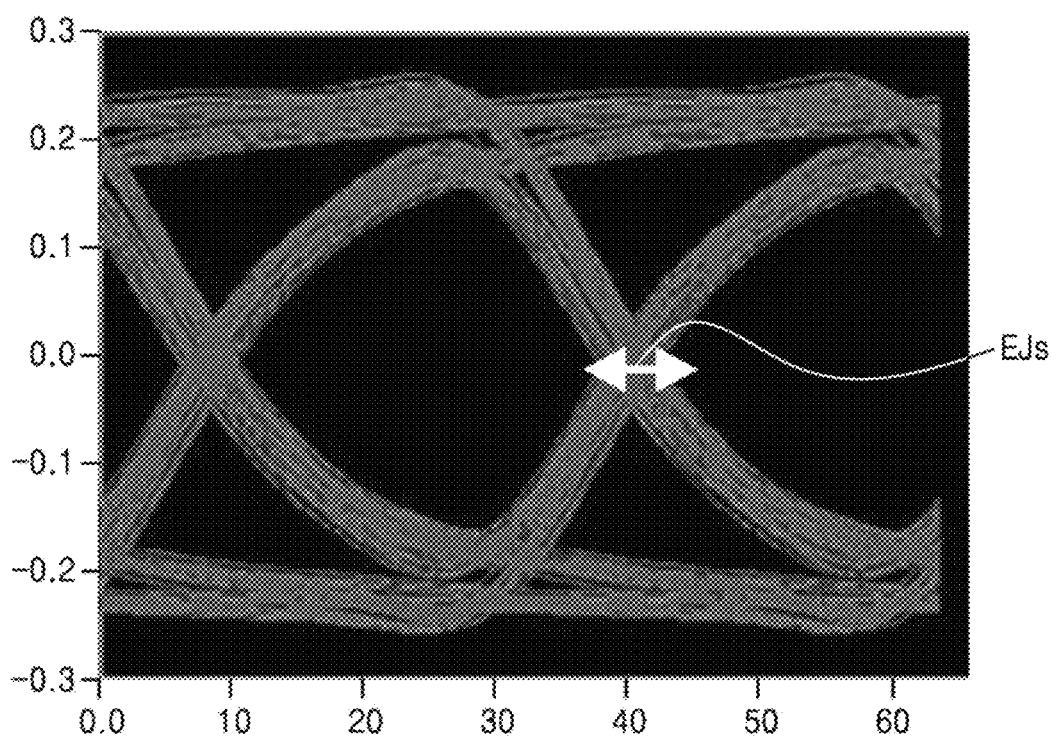
FIGS. 3A and 3B are eye diagram photos of the substrate of the comparative example of FIG. 2A and the substrate of FIG. 1B.
Figure 3B:
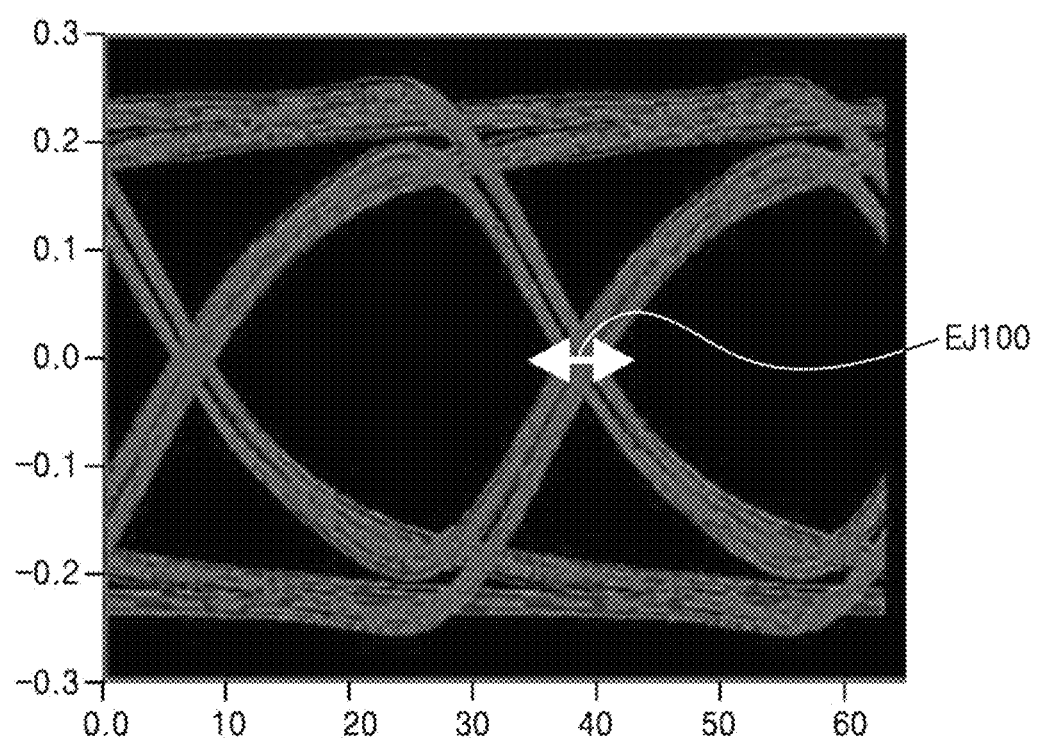
Figure 3C:
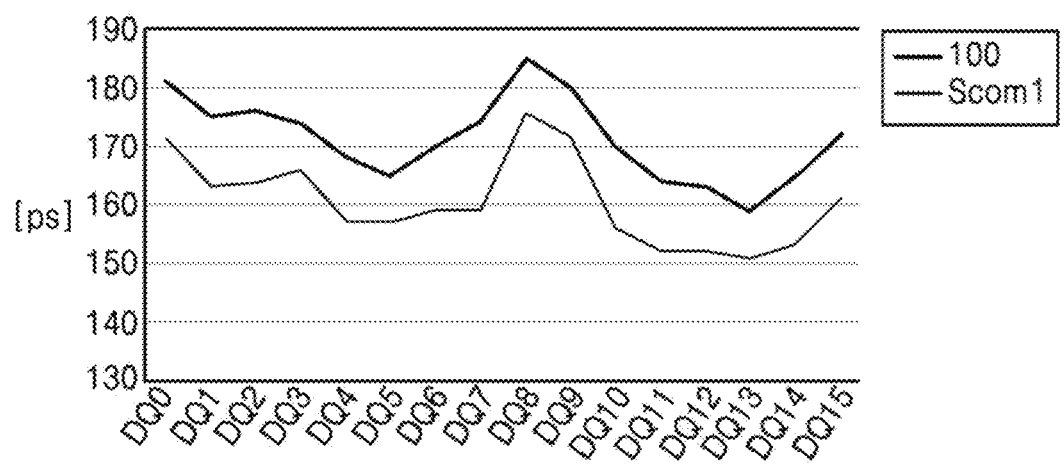
FIG. 3C is a graph showing eye open values of the substrate of the comparative example of FIG. 2A and the substrate of FIG. 1B at various signals.

FIGS. 3A and 3B are eye diagram photos of the substrate Scom1 of the comparative example of FIG. 2A and the substrate 100 of FIG. 1B, and FIG. 3C is a graph showing eye open values of the substrate Scom1 of the comparative example of FIG. 2A and the substrate 100 of FIG. 1B at various signals. In the graphs of FIGS. 3A and 3B, the x-axis is time and the unit is picosecond (ps), and the y-axis is amplitude and the unit is an arbitrary unit. In the graph of FIG. 3C, the x-axis represents a type of signal, the y-axis is the eye open, and the unit is ps.

Referring to FIGS. 3A and 3B, in the eye diagrams, it may be determined that the double arrow portions indicate eye jitter or timing jitter, and an eye jitter value EJ100 for the substrate 100 of FIG. 1B as illustrated in FIG. 3B is less than an eye jitter value EJs for the substrate Scom1 of the comparative example of FIG. 2A as illustrated in FIG. 3A. For reference, the eye jitter is a measure of a width of a portion where rising and falling of a waveform intersect, and the eye jitter is better when it is narrower.

Referring to FIG. 3C, eye open values of the substrate 100 of FIG. 1B and the substrate Scom1 of the comparative example of FIG. 2A are shown for various signals, e.g., 16 data signals DQ0 to DQ15, and in general, it may be seen that the eye open value of the substrate 100 of FIG. 1B is high. For reference, an eye open or eye width refers to a time interval during which a received signal may be sampled, the eye open value is better when it is larger. When noise is introduced, the eye open value decreases. As a result, as can be seen from the eye jitter values and the eye open values of FIGS. 3A, 3B and 3C, it may be determined that the signal characteristics of the substrate 100 of FIG. 1B corresponding to an example embodiment is superior to the signal characteristics of the substrate Scom1 of the comparative example of FIG. 2A.

Figure 4A:
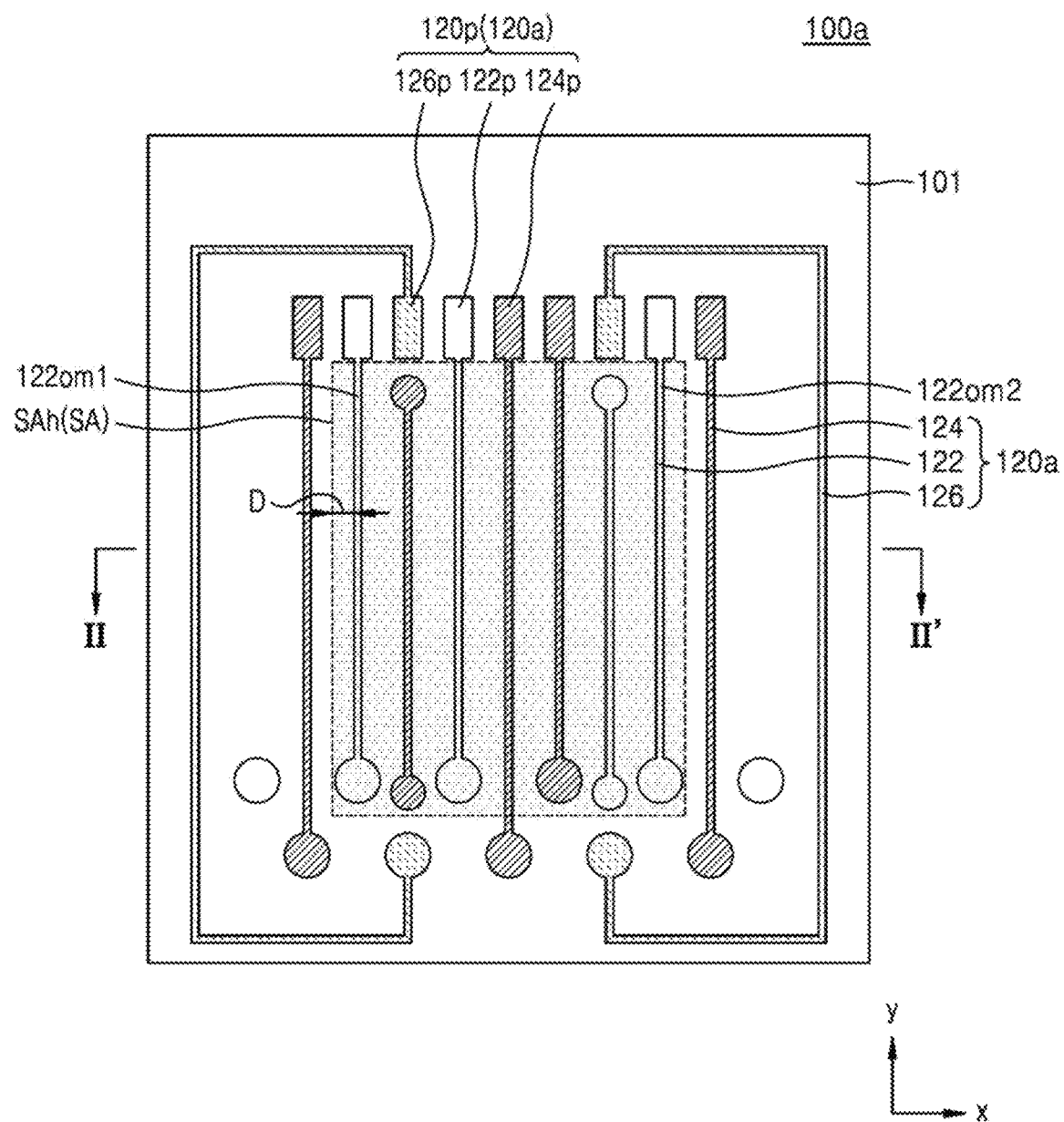
FIGS. 4A and 4B are respectively a plan view and a cross-sectional view of a substrate for noise prevention according to an example embodiment, and also respectively a plan view and a cross-sectional view for explaining a signal area.
Figure 4B:
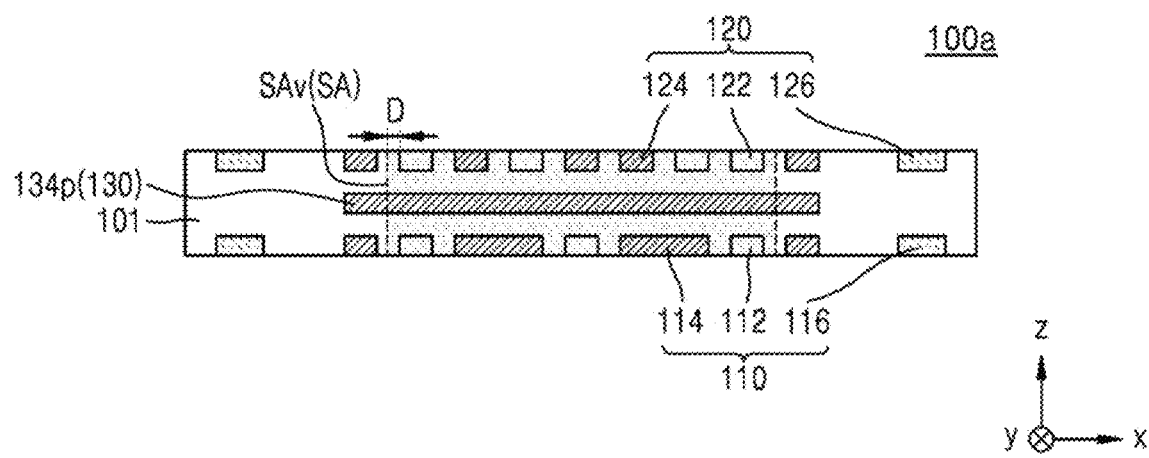

FIGS. 4A and 4B are respectively a plan view and a cross-sectional view of a substrate 100a according to an example embodiment, and also respectively a plan view and a cross-sectional view for explaining a signal area. FIG. 4B is a cross sectional view taken along section II-II' of FIG. 4A. Descriptions, already given above are repeatedly briefly or omitted.

Referring to FIGS. 4A and 4B, the substrate 100a of an example embodiment may be different from the substrate 100 of FIG. 1A in positions of pins and wiring lines of a first wiring layer 120a. In particular, in the substrate 100a of an example embodiment, in a central portion of the first direction (x direction), two upper signal lines 122 may be arranged adjacent to each other, and two upper ground lines 124 and corresponding ground pins 124p may be arranged adjacent to each other. In addition, similar to the substrate 100 of FIG. 1A, in the substrate 100a of an example embodiment, the lower and upper signal lines 112 and 122 may connect the signal pins 122p by passing through the signal area SA. The lower and upper ground lines 114 and 124 may connect the ground pins 124p by passing through the signal area SA, or may connect the ground pins 124p outside the signal area SA. On the contrary, the lower and upper power lines 116 and 126 connecting the power pins 126p are routed around the signal area SA, and do not pass through the signal area SA. In this regard, no power lines are present within a continuous three-dimensional space corresponding to the signal area SA.

The arrangement positions of the upper signal lines 122 and upper ground lines 124, and corresponding pins of the substrate 100 of FIG. 1A and the substrate 100a of FIG. 4A are merely examples. For example, the lower and upper signal lines 112 and 122 and the lower and upper ground lines 114 and 124 may be arranged in various positions and shapes in the signal area SA, including those described below.

The signal area SA may be defined by an area occupied by a signal group. As described above, the signal group may indicate a group of signal lines having substantially the same operating speed and function. In FIGS. 1A and 4A, assuming that the lower and upper signal lines 112 and 114 all have the same operating speed and function, all of the lower and upper signal lines 112 and 114 may form one signal group.

The signal area SA is an area occupied by a signal group, and is indicated by a hatched portion surrounded by dashed lines in FIGS. 4A and 4B. In particular, the signal area SA may be defined to include outermost signal lines 122om1 and 122om2 forming the signal group. In addition, the signal area SA may be defined to not include the lower and upper power lines 116 and 126. The lower and upper ground lines 114 and 124 may or may not be included in the signal area SA. For example, in FIGS. 4A and 4B, the lower and upper ground lines 114 and 124 on both outermost sides in the first direction (x direction) may not be included in the signal area SA, and only lower and upper ground lines 114 and 124 arranged between the lower and upper signal lines 112 and 122 may be included in the signal area SA. According to an example embodiment, on the premise that the lower and upper power lines 116 and 126 are not included, the signal area SA may be defined to include the outermost ground lines. In addition, as shown in FIG. 4B, the ground plane 134p may also be partially provided outside the signal area SA.

A distance D between an edge (a dashed line portion) of the signal area SA and the outermost signal lines 122om1 and 122om2 may be, for example, 500 µm or more. An upper limit of the distance D between the edge of the signal area SA and the outermost signal lines 122om1 and 122om2 may vary depending on the type of the substrate 100a. For example, when the substrate 100a has a relatively small size like a package substrate of a memory package, the upper limit of the distance D between the edge of the signal area SA and the outermost signal lines 122om1 and 122om2 may be about 1 mm. On the contrary, when the substrate 100a has a relatively large size like a system board or the like, the upper limit of the distance D between the edge of the signal area SA and the outermost signal lines 122om1 and 122om2 may be about 5 mm. The distance D between the edge of the signal area SA and the outermost signal lines 122om1 and 122om2 is not limited to the numerical range described above.

As shown in FIG. 4A, the signal area SA may have a horizontal signal area SAh defined in a horizontal direction parallel to an upper surface of the substrate 100a, and as shown in FIG. 4B a vertical signal area SAv defined in a vertical direction perpendicular to the upper surface of the substrate 100a. The horizontal signal area SAh and the vertical signal area SAv may define a continuous three-dimensional space corresponding to the signal area SA. As discussed above with respect to the signal area SA, only the lower and upper signal lines 112 and 122 may be included in the horizontal signal area SAh, and the lower and upper power lines 116 and 126 may not be included. In addition, only the lower and upper signal lines 112 and 122 may be included in the vertical signal area SAv, and the lower and upper power lines 116 and 126 may not be included. For the lower and upper ground lines 114 and 124, some may be included in the horizontal signal area SAh and the vertical signal area SAv, and some of them may not be included.

Figure 5A:
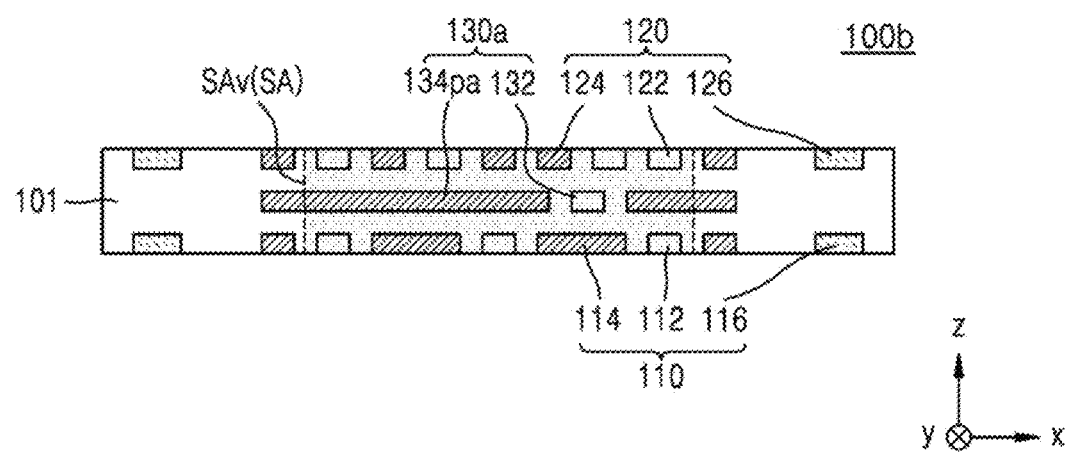
FIGS. 5A, 5B and 5C are cross-sectional views each illustrating a substrate for noise prevention, according to example embodiments.
Figure 5B:
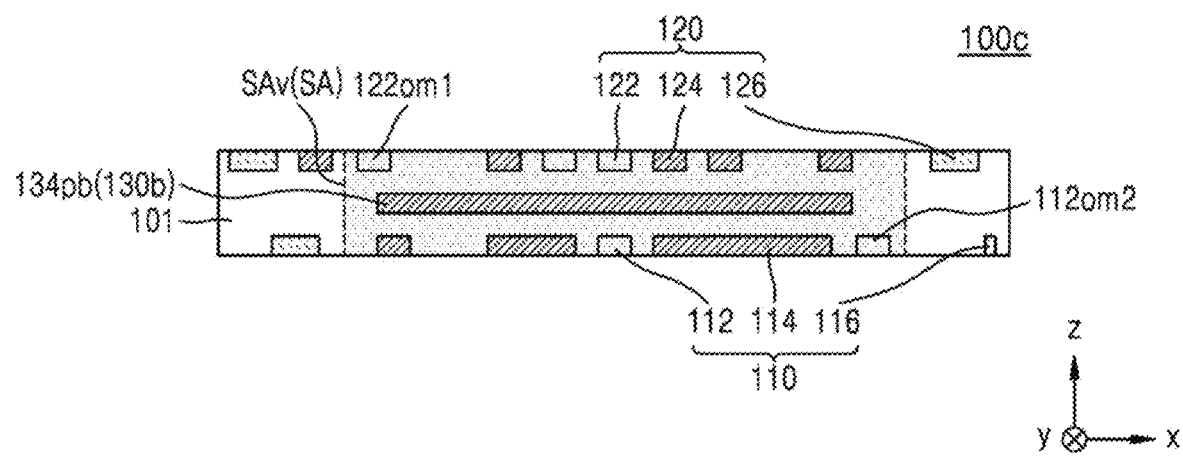
Figure 5C:
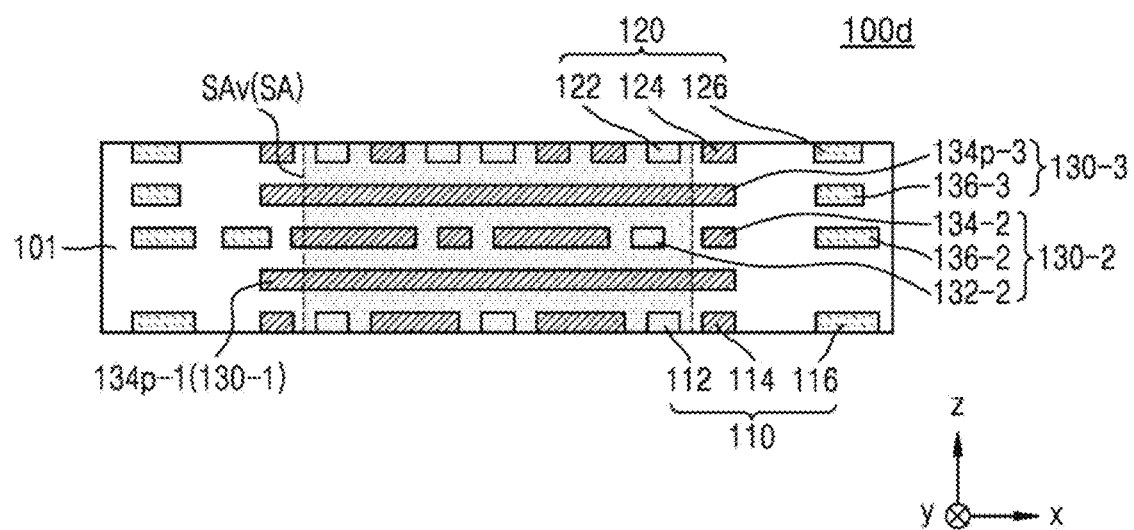
Figure 5D:
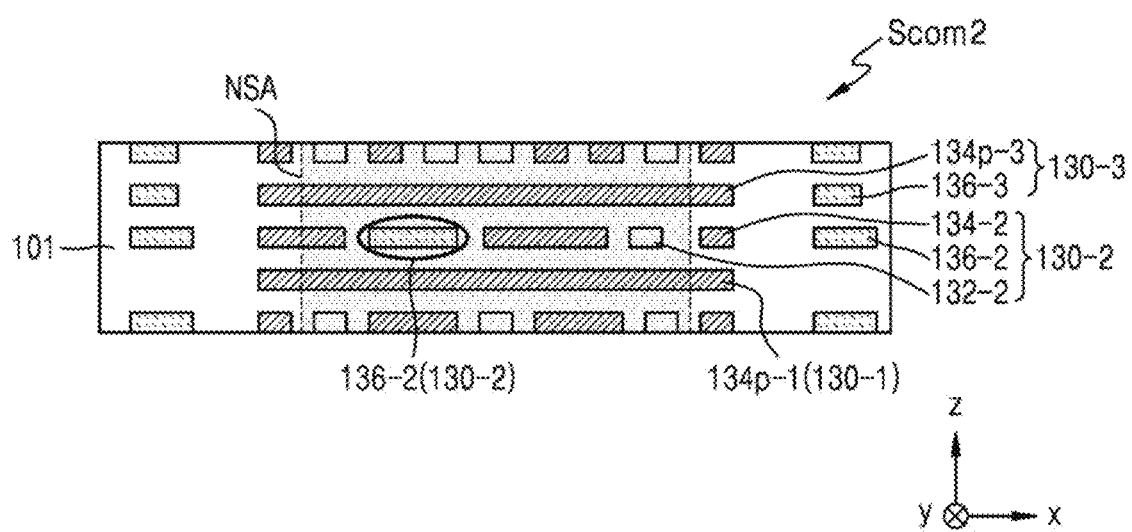
FIG. 5D is a cross-sectional view of a substrate of a comparative example.

FIGS. 5A, 5B and 5C are cross-sectional views each illustrating a substrate, according to example embodiments, and FIG. 5D is a cross-sectional view of a substrate of a comparative example. Descriptions, already given above are repeated briefly or omitted.

Referring to FIG. 5A, a substrate 100b of an example embodiment may be different from the substrate 100a of FIG. 4A in a structure of an internal wiring layer 130a. In particular, in the substrate 100b, the internal wiring layer 130a may include an internal signal line 132 and a ground plane 134pa. The lower ground line 114, the upper ground line 124, and the ground plane 134pa may be provided around the internal signal line 132. As a result, in the substrate 100b, the internal wiring layer 130a may further include the internal signal line 132, an internal ground line, an internal power line, or the like, as well as the ground plane 134pa. However, in the vertical signal area SAv, only the ground plane 134pa, the internal signal line 132, the internal ground line, or the like may be included, and no internal power line may be included in the vertical signal area SAv.

Referring to FIG. 5B, a substrate 100c of an example embodiment may be different from the substrate 100 or 100a of FIG. 1A or 4A in positions of the lower and upper signal lines 112 and 122 arranged in the vertical signal area SAv and a structure of an internal wiring layer 130b. In particular, in the substrate 100c, the outermost signal lines 112om2 and 122om1 may be arranged adjacent to one edge portion of the vertical signal area SAv. For example, in the case of the lower wiring layer 110, an outermost signal line 112om2 may be arranged adjacent to the right edge of the vertical signal area SAv, and the lower ground line 114 may be arranged adjacent to the left edge of the vertical signal area SAv instead of a signal line. In addition, for the upper wiring layer 120, an outermost signal line 122om1 may be arranged adjacent to the left side of the vertical signal area SAv, and the lower ground line 114 may be arranged adjacent to the right side of the vertical signal area SAv instead of a signal line.

A ground plane 134pb of the internal wiring layer 130b may be arranged only in the vertical signal area SAv. However, example embodiments are not limited thereto and the ground plane 134pb may extend outside of the vertical signal area SAv in the first direction (x direction).

It may be seen, from FIG. 5B, that the signal area SA needs not to be defined such that both edges of the signal area SA are adjacent to an outermost signal line. In other words, as long as signal lines forming a signal group are all included in the signal area SA, the signal area SA may be defined such that a ground line is adjacent to the edge of the signal area SA. In addition, in the substrate 100 or 100a of FIG. 1A or 4A, based on the fact that the ground plane 134p extends to the outside of the vertical signal area SAv and a portion of the ground plane 134p is included in the vertical signal area SAv, it may be determined that the signal area SA may be defined such that the signal area SA includes only a portion of the ground line.

Referring to FIGS. 5C and 5D, a substrate 100d of an example embodiment may be different from the substrates 100 and 100a to 100c of FIGS. 1A, 4A, 5A, and 5B in including multi-layered internal wiring layers (i.e., first to third internal wiring layers 130-1, 130-2, and 130-3). In particular, the substrate 100d may include the lower wiring layer 110, the upper wiring layer 120, the first internal wiring layer 130-1, the second internal wiring layer 130-2, and the third internal wiring layer 130-3.

The first internal wiring layer 130-1 may include a ground plane 134p-1, the second internal wiring layer 130-2 may include an internal signal line 132-2, an internal ground line 134-2, and an internal power line 136-2, and the third internal wiring layer 130-3 may include a ground plane 134p-3 and a power line 136-3. In each of the first internal wiring layer 130-1, the second internal wiring layer 130-2, and the third internal wiring layer 130-3 of FIG. 5C, configuration of the wirings is provided as an example, and each of the first internal wiring layer 130-1, the second internal wiring layer 130-2, and the third internal wiring layer 130-3 may include other wirings. In addition, in FIG. 5C, the substrate 100d includes three internal wiring layers, but the internal wiring layers are not limited to three layers. For example, the substrate 100d may include four or more internal wiring layers.

Also, in the substrate 100d of an example embodiment, the signal area SA, for example, the vertical signal area SAv may be defined as described above. That is, the vertical signal area SAv may be defined to include outermost signal lines among signal lines forming a signal group. When an area is defined to deviate from at least one of signal lines forming a signal group, the area may not correspond to a signal area. In addition, even when an area is defined to include at least one power line, the area may not correspond to a signal area.

As shown in FIG. 5D, substrate Scom2 of a comparative example includes power line 136-2 (a circled portion) of the second internal wiring layer 130-2 and therefore an area NSA including the power line 136-2 does not correspond to a signal area. This is the case even when the power line 136-2 is completely surrounded by ground lines and ground planes.

In addition, in the substrates of example embodiments, the signal area SA being defined does not mean that the signal area SA is defined on a substrate on which wirings are already arranged and designed, but indicates that the wirings are arranged and designed on the substrate such that the signal area SA is defined. For example, in the substrates of example embodiments, the signal area SA may indicate that power lines are arranged and designed to bypass the signal area SA, thereby defining the signal area SA. In this regard, no power lines are present within a continuous three-dimensional space corresponding to the signal area SA.

Figure 6A:
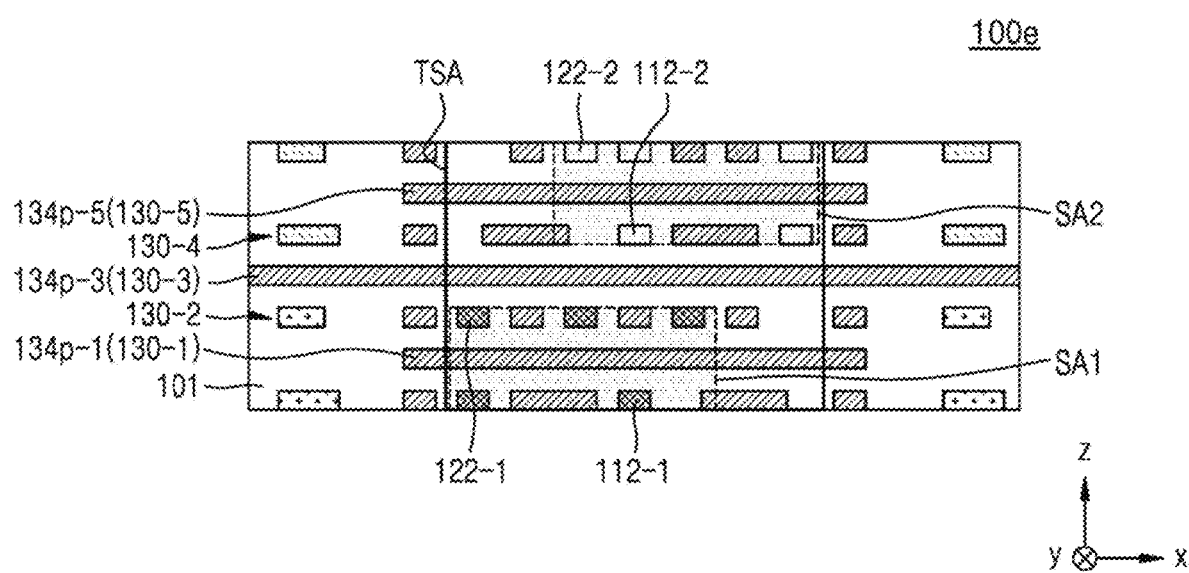
FIGS. 6A, 6B and 6C are cross-sectional views each illustrating a substrate for noise prevention, according to example embodiments.
Figure 6B:
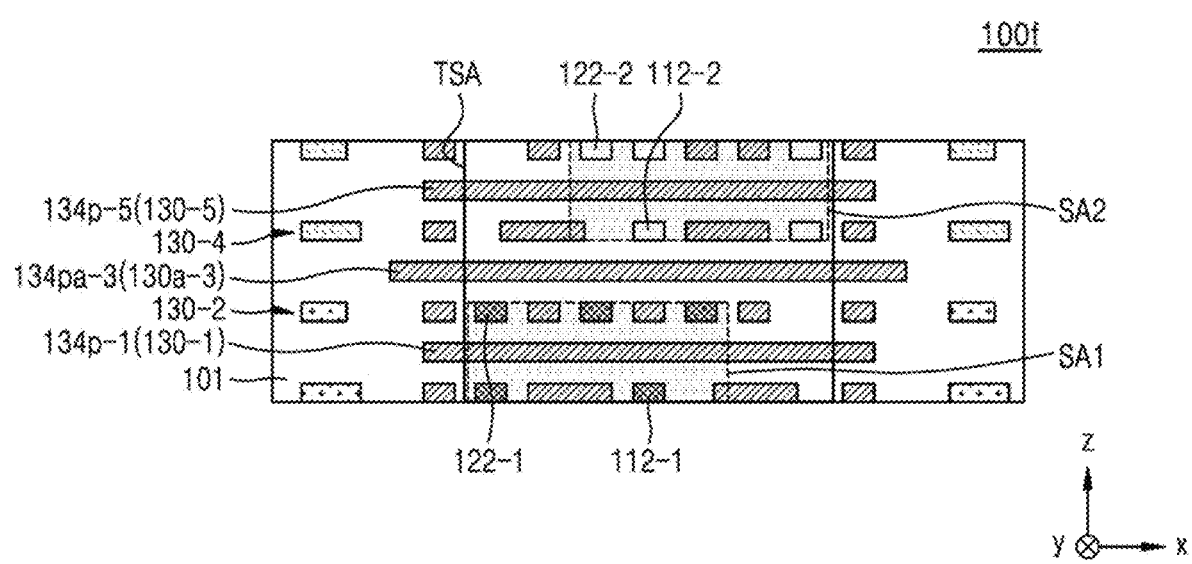
Figure 6C:
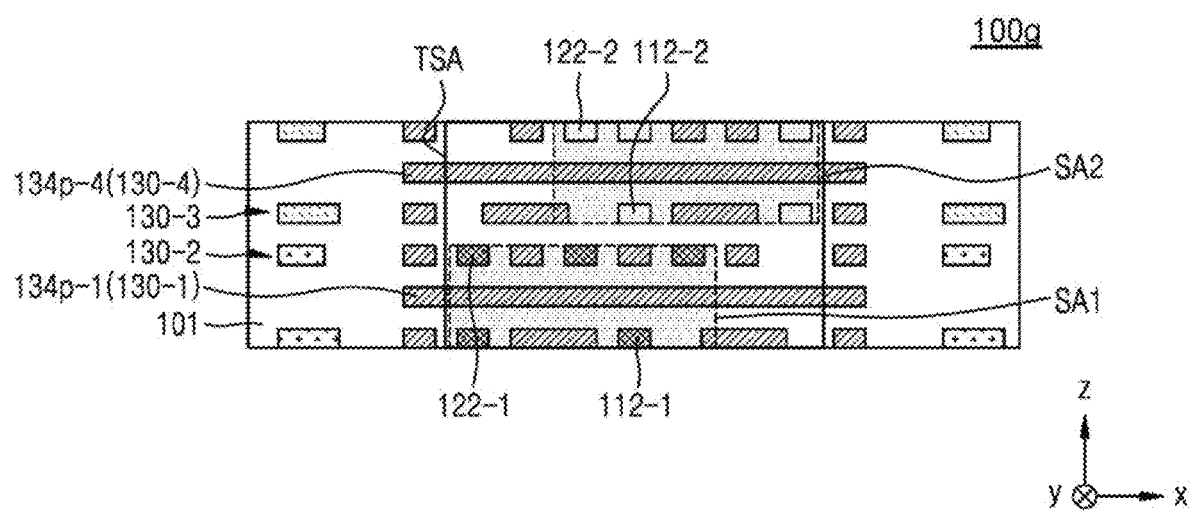

FIGS. 6A, 6B and 6C are cross-sectional views each illustrating a substrate, according to example embodiments. Descriptions, already given above are briefly repeated or omitted.

Referring to FIG. 6A, a substrate 100e of an example embodiment may be different from the substrates 100 and 100a to 100d of FIGS. 1A, 4A, and 5A, 5B and 5C in that two signal areas (i.e., first and second signal areas SA1 and SA2) are defined, and a total signal area TSA including the two signal areas SA1 and SA2 is also defined. In particular, in the substrate 100e, five internal wiring layers (i.e., first to fifth internal wiring layers 130-1 to 130-5) may be arranged in the body layer 101. In addition, a signal group may be divided into two groups, and two signal areas (i.e., the first and second signal areas SA1 and SA2) may be defined by the two signal groups. For example, a first signal group may include first lower signal lines 112-1 and first upper signal lines 122-1, and the first signal area SA1 may be defined to include signal lines of the first signal group. In addition, a second signal group may include second lower signal lines 112-2 and second upper signal lines 122-2, and the second signal area SA2 may be defined to include signal lines of the second signal group. Here, each of the first signal area SA1 and the second signal area SA2 may correspond to a vertical signal area. Because the first lower and upper signal lines 112-1 and 122-1 of the first signal group SA1 and the second lower and upper signal lines 112-2 and 122-2 of the second signal group SA2 have different characteristics from each other, they are indicated with different hatchings in FIG. 6A.

The first to fifth internal wiring layers 130-1 to 130-5 are arranged in the body layer 101, and the third internal wiring layer 130-3 may include the ground plane 134p-3 between the first signal area SA1 from the second signal area SA2. As shown in FIG. 6A, the ground plane 134p-3 may extend entirely across the body layer 101 in the first direction (x direction). For example, the ground plane 134p-3 may also extend entirely across the body layer 101 in the second direction (y direction). Accordingly, the ground plane 134p-3 may be referred to as a ground full plane.

In the substrate 100e of an example embodiment, the total signal area TSA including two signal areas (i.e., the first and second signal areas SA1 and SA2) may be defined. Because the total signal area TSA includes two signal areas (i.e., the first and second signal areas SA1 and SA2), the total signal area TSA may be defined to include all signal lines of the substrate 100e. In addition, like a general signal area, no powers line may be included in the total signal area TSA. As can be seen from FIG. 6A, because positions of the first signal area SA1 and the second signal area SA2 are different in the first direction (x direction), an internal ground line and at least a portion of the ground plane may be additionally included in the total signal area TSA. In addition, a power level of a power line corresponding to the first signal area SA1 and a power level of a power line corresponding to the second signal area SA2 may be different from each other. Accordingly, in FIG. 6A, hatchings of a power line adjacent to the first signal area SA1 and a power line adjacent to the second signal area SA2 may be differently shown.

Referring to FIG. 6B, a substrate 100f of an example embodiment may be different from the substrate 100e of FIG. 6A in a structure of a third internal wiring layer 130a-3. In particular, in the substrate 100f of an example embodiment, a ground plane 134pa-3 of the third internal wiring layer 130a-3 may be arranged across only a portion of the body layer 101 in the first direction (x direction). In other words, the ground plane 134pa-3 of the third internal wiring layer 130a-3 may not have a ground full plane structure. As shown in FIG. 6B, the ground plane 134pa-3 of the third internal wiring layer 130a-3 may have a structure extending to the outside of the total signal area TSA in the first direction (x direction).

Referring to FIG. 6C, a substrate 100g according to an example embodiment may be different from the substrate 100e of FIG. 6A in that the body layer 101 does not include a ground full plane or an internal wiring layer having a similar structure thereto. In particular, in the substrate 100g of an example embodiment, first to fourth wiring layers 130-1 to 130-4 may be arranged in the body layer 101. In addition, the first signal area SA1 may be defined at a lower portion of the body layer 101, and the second signal area SA2 may be defined at an upper portion of the body layer 101. However, a ground full plane separating the first signal area SA1 and the second signal area SA2 or an internal wiring layer having a similar structure thereto may not be arranged in the body layer 101. As shown in FIG. 6C, even when an internal wiring layer separating the first signal area SA1 and the second signal area SA2 is not arranged, the total signal area TSA including the first signal area SA1 and the second signal area SA2 may be defined.

Figure 7A:
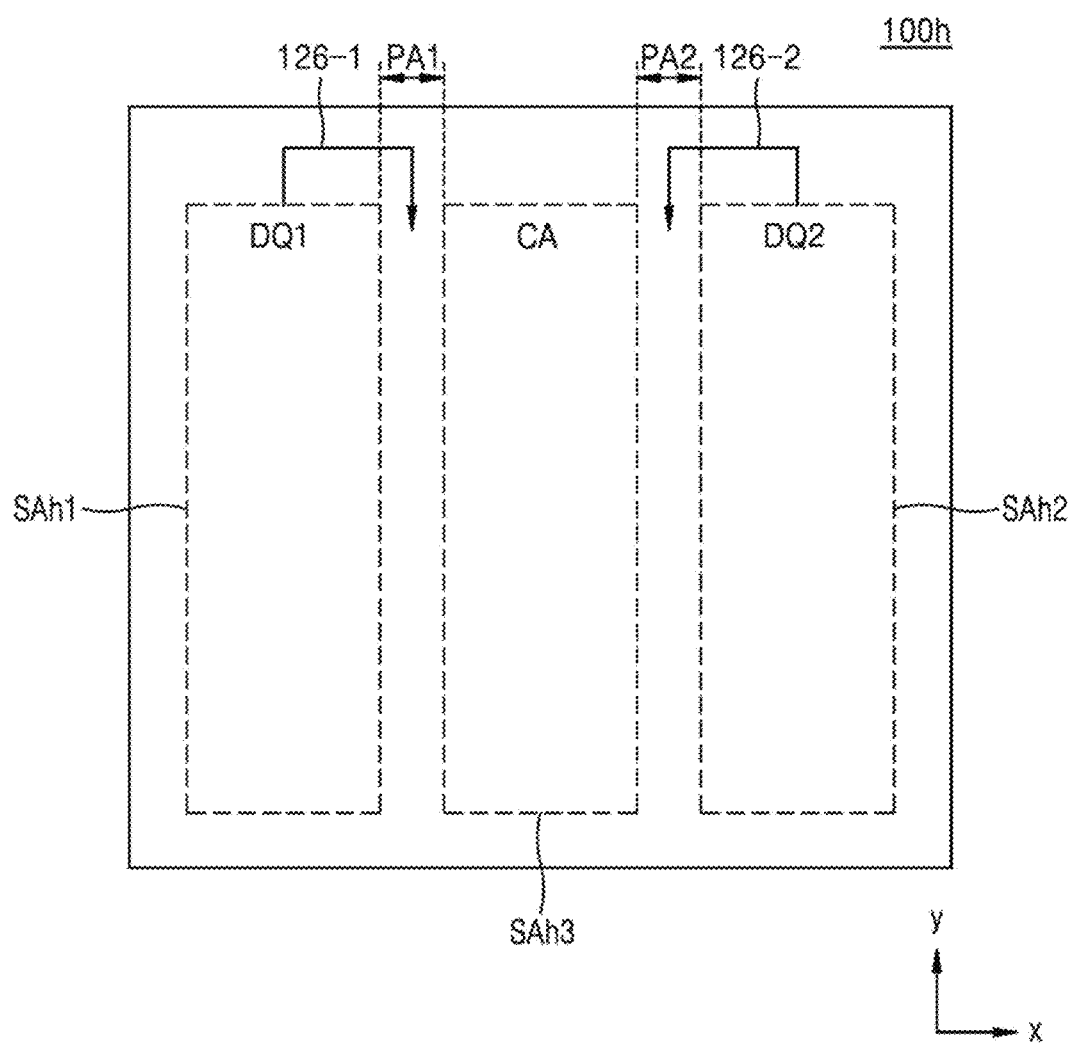
FIGS. 7A and 7B are plan views each illustrating a substrate for noise prevention, according to example embodiments.
Figure 7B:
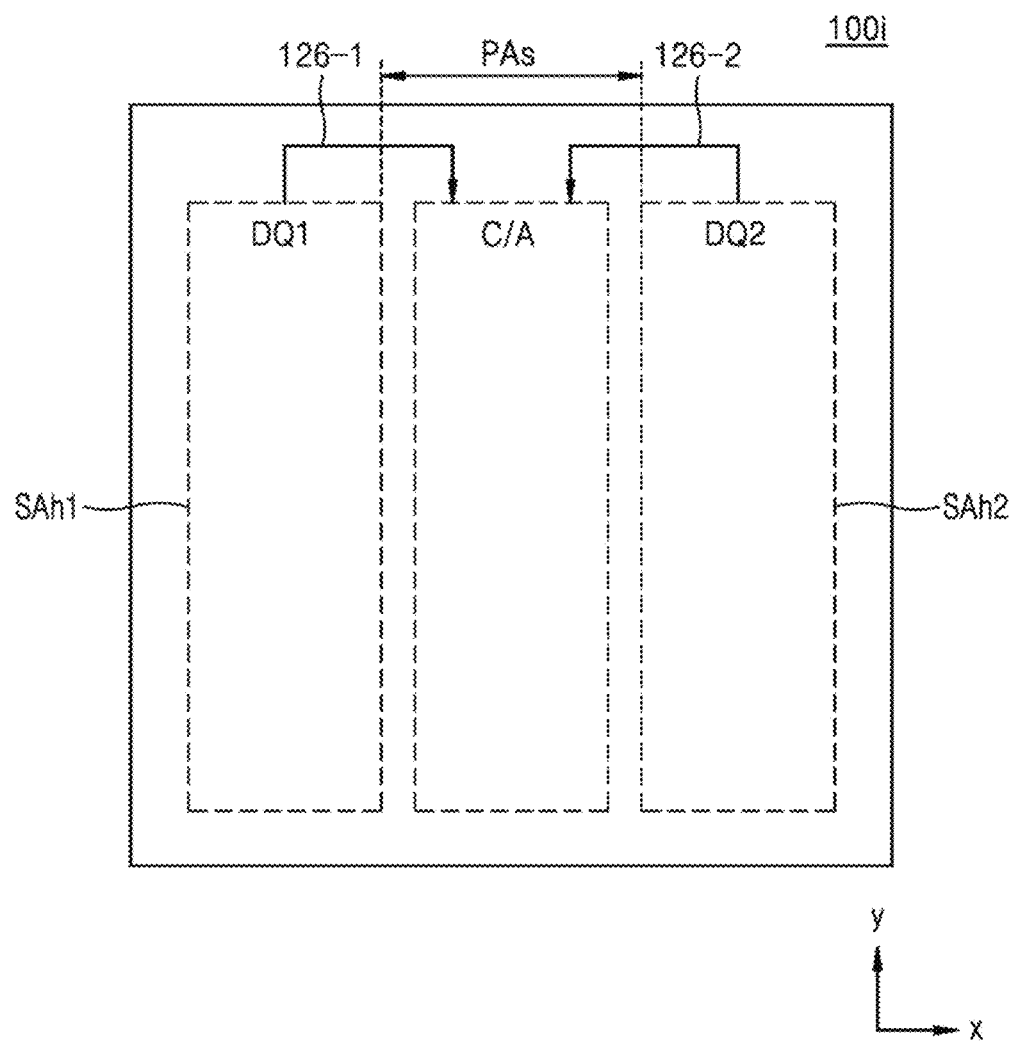

FIGS. 7A and 7B are plan views each illustrating a substrate, according to example embodiments. Descriptions, already given above are repeated briefly or omitted.

Referring to FIG. 7A, a substrate 100h of an example embodiment may be different from the substrate 100 or 100a of FIG. 1A or 4A in that three horizontal signal areas (i.e., first to third horizontal signal areas SAh1, SAh2, and SAh3) are defined. In particular, in the substrate 100h, signal lines may be divided into three signal groups, for example, a first data signal group DQ1, a second data signal group DQ2, and a command/address signal group CA. As shown in FIG. 7A, the first data signal group DQ1 may be arranged at the left portion of the substrate 100h, the second data signal group DQ2 may be arranged at the right portion of the substrate 100h, and the command/address signal group CA may be arranged at the central portion of the substrate 100h. Accordingly, the first horizontal signal area SAh1 corresponding to the first data signal group DQ1 may be defined arranged at the left portion of the, the second horizontal signal area SAh2 corresponding to the second data signal group DQ2 may be arranged at the right portion of the substrate 100*h*, and the third horizontal signal area SAh3 corresponding to the command/address signal group CA may be arranged at the central portion of the substrate 100*h*.

A first pass area PA1 may be arranged between the first horizontal signal area SAh1 and the third horizontal signal area SAh3 in the first direction (x direction), and a second pass area PA2 may be arranged between the third horizontal signal area SAh3 and the second horizontal signal area SAh2 in the first direction (x direction). First upper power lines 126-1 connecting power pins corresponding to the first horizontal signal area SAh1 may be routed through the first pass area PA1 in order to bypass the first horizontal signal area SAh1. In addition, second upper power lines 126-2 connecting power pins corresponding to the second horizontal signal area SAh2 may be routed through the second pass area PA2 in order to bypass the second horizontal signal area SAh2. When there are power pins corresponding to the third horizontal signal area SAh3, corresponding power lines connecting the power pins may be routed through the first pass area PA1 or the second pass area PA2 in order to bypass the third horizontal signal area SAh3. In this regard, no power lines are present within the continuous three-dimensional spaces corresponding to the signal areas.

In addition, according to an example embodiment, the first pass area PA1 and the second pass area PA2 may be omitted. In this case, the first upper power lines 126-1 may be routed around the left side of the first horizontal signal area SAh1 to connect the power pins corresponding to the first horizontal signal area SAh1 without passing through the first horizontal signal area SAh1, and the second upper power lines 126-2 may be routed around the right side of the second horizontal signal area SAh2 to connect the power pins corresponding to the second horizontal signal area SAh2 without passing through the second horizontal signal area SAh2. In addition, according to an example embodiment, both side portions of the first horizontal signal area SAh1 and both side portions of the second horizontal signal area SAh2 in the first direction (x direction) may also be used as a bypass path. In this regard, no power lines are present within continuous three-dimensional spaces corresponding to the signal areas SA.

Referring to FIG. 7B, a substrate 100*i* of an example embodiment may be different from the substrate 100*h* of FIG. 7A in that two horizontal signal areas (i.e., first and second horizontal signal areas SAh1 and SAh2) are defined. In particular, in the substrate 100*i*, signal lines may be divided into two signal groups, for example, the first data signal group DQ1 and the second data signal group DQ2. Unlike the substrate 100*h* of FIG. 7A, the command/address signal lines C/A may not form a group. Accordingly, the first horizontal signal area SAh1 corresponding to the first data signal group DQ1 may be defined at the left portion of the substrate 100*i*, and the second horizontal signal area SAh2 corresponding to the second data signal group DQ2 may be defined at the right portion of the substrate 100*i*).

A central portion in which the command/address signal lines C/A are arranged may be included in a common path area PAs. Accordingly, the first upper power lines 126-1 connecting power pins corresponding to the first horizontal signal area SAh1 may be routed through the common path area PAs and thereby bypass the first horizontal signal area SAh1. In addition, the second upper power lines 126-2 connecting power pins corresponding to the second horizontal signal area SAh2 may be routed through the common path area Pas and thereby bypass the second horizontal signal area SAh2. In this regard, no power lines are present within continuous three-dimensional spaces corresponding to the signal areas SA.

FIGS. 8A, 8B, 9 and 10 are cross-sectional views each illustrating a semiconductor package, according to example embodiments. Descriptions will be made with reference to FIGS. 1A and 1B together, and those already given will be briefly described or omitted.

Figure 8A:
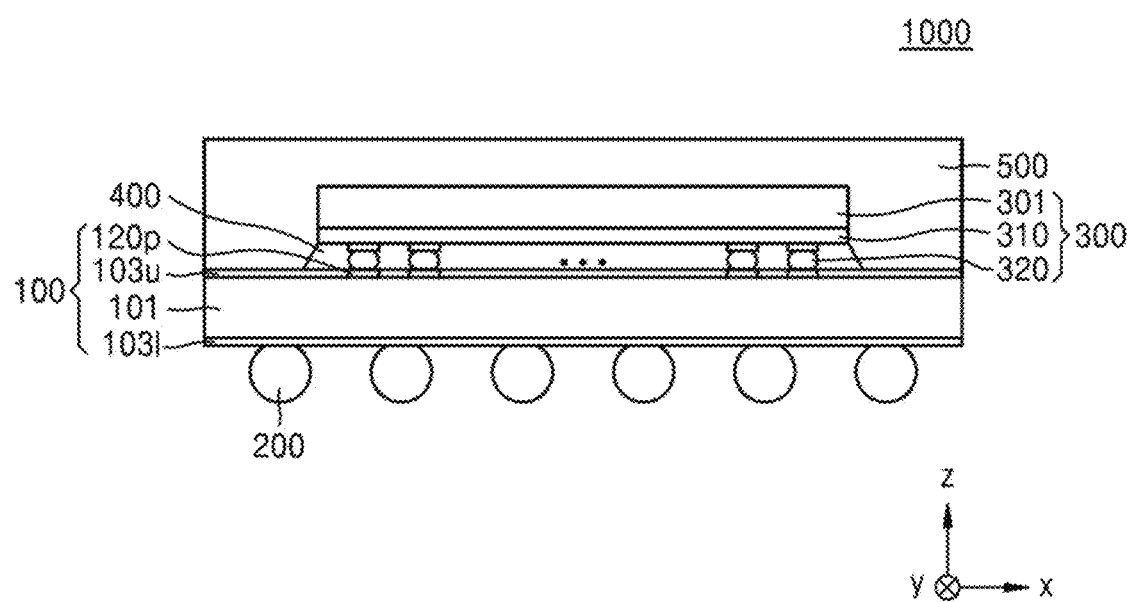
FIGS. 8A, 8B, 9 and 10 are cross-sectional views each illustrating a semiconductor package, according to example embodiments.

Referring to FIG. 8A, a semiconductor package 1000 of an example embodiment may include a substrate 100 (i.e., a package substrate), an external connection terminal 200, a semiconductor chip 300, an adhesive layer 400, and a sealing member 500.

The substrate 100 may be the substrate 100 of FIG. 1A. However, the substrate 100 is not limited to the substrate 100 of FIG. 1A. For example, the substrate 100 may be any one of substrates 100*a* to 100*i* of FIGS. 4A, 5A, 5B, 5C, 6A, 6B, 7A and 7B. As described above, in the substrate 100, the body layer 101 may be formed based on a PCB, an organic panel, a glass substrate, or the like, that does not include a semiconductor material. However, according to an example embodiment, the body layer 101 may be formed based on a semiconductor material such as a silicon (Si) wafer or the like. When the body layer 101 includes a semiconductor material, an integrated device layer may be arranged inside the body layer 101 according to an example embodiment. As shown in FIG. 8A, lower and upper protective layers 103*l* and 103*u* may be respectively arranged on a lower surface and an upper surface of the body layer 101. In FIG. 8A, the lower wiring layer 110, the upper wiring layer 120, and the internal wiring layer 130 are not illustrated, and only the pins 120*p* or pads are shown. The pins 120*p* may be exposed through the upper protective layer 103*u*. The lower wiring layer 110, the upper wiring layer 120, and the internal wiring layer 130 are also not illustrated in the semiconductor packages of other example embodiments discussed below.

The external connection terminal 200 may be arranged on the lower surface of the substrate 100. The external connection terminal 200 may be electrically connected to the lower wiring layer 110 of the substrate 100. The external connection terminal 200 may include a solder ball. However, according to an example embodiment, the external connection terminal 200 may also have a structure including a pillar and a solder. The semiconductor package 1000 may be mounted on an external substrate such as an interposer or a base substrate through the external connection terminal 200.

The semiconductor chip 300 may be stacked on the substrate 100. In the semiconductor package 1000, although one semiconductor chip 300 is stacked on the substrate 100, the number of semiconductor chips 300 stacked on the substrate 100 is not limited to one. For example, a plurality of semiconductor chips 300 may be stacked on the substrate 100. A structure in which the plurality of semiconductor chips 300 are stacked on the substrate 100 will be described in more detail below with reference to FIG. 8B.

The semiconductor chip 300 may include a chip substrate 301, a device layer 310, and a bump 320. The chip substrate 301 may be formed based on a semiconductor material and may be a silicon wafer or the like. The device layer 310 may be arranged on a lower surface of the chip substrate 301, and may include various types of devices. For example, the device layer 310 may include a field effect transistor (FET) like a planar FET or a FinFET, a flash memory, a memory device such as dynamic random access memory (DRAM), static random access memory (SRAM), electrically erasable programmable read-only memory (EEPROM), phase-change random access memory (PRAM), magneto-resistive random access memory (MRAM), ferroelectric random access memory (FeRAM), resistive random access memory (RRAM), a logic device such as AND, OR, and NOT logic gates, and various active and/or passive devices such as system large scale integration (LSI), complementary metal-oxide-semiconductors (CMOS) imaging sensors (CIS), a micro-electro-mechanical system (MEMS). For example, in the semiconductor package 1000, the semiconductor chip 300 may be a DRAM chip including DRAM devices in the device layer 310. Accordingly, the semiconductor package 1000 may be used in a high bandwidth memory (HBM) product, an electro date processing (EDP) product, or the like. In the semiconductor package 1000, the type of the semiconductor chip 300 is not limited to a DRAM chip.

The bump 320 may be arranged on a lower surface of the device layer 310 and electrically connected to the device layer 310 through a wiring. The bump 320 may include, for example, a pillar and a solder. According to an example embodiment, the bump 320 may also include only a solder without including a pillar.

According to an example embodiment, the semiconductor chip 300 may be mounted on the substrate 100 through wire bonding. In this case, the bump 320 may be omitted. In addition, the semiconductor chip 300 may be mounted on the substrate 100 in a structure in which the device layer 310 faces upward, and the semiconductor chip 300 may be electrically connected to the substrate 100 through a wire.

The semiconductor chip 300 may be mounted on the substrate 100 through the bump 320 and the adhesive layer 400. The adhesive layer 400 may be formed as an adhesive film such as an underfill and a non-conductive film (NCF). According to an example embodiment, the semiconductor package 1000 may be manufactured by a molded underfill (MUF) operation, and in this case, the adhesive layer 400 may be omitted.

The sealing member 500 may cover a portion of the upper surface of the substrate 100, an upper surface of the semiconductor chip 300, side surfaces of the semiconductor chip 300, and side surfaces of the adhesive layer 400. As shown in FIG. 8A, the sealing member 500 may have a certain thickness and cover the upper surface of the semiconductor chip 300. However, according to an example embodiment, the sealing member 500 may not cover the upper surface of the semiconductor chip 300 such that the upper surface of the semiconductor chip 300 is exposed through the sealing member 500 to the outside. The sealing member 500 may include, for example, an epoxy mold compound (EMC). However, the material of the sealing member 500 is not limited thereto.

In the semiconductor package 1000, the substrate 100 does not include power lines in the signal area SA. That is, the signal area SA may include only signal lines and ground lines, and no power lines may be included in the signal area SA. As described above, in the semiconductor package 1000, power lines are not arranged in the signal area SA of the substrate 100, and thus, noise due to the power lines may be suppressed, and accordingly, a semiconductor package with improved SI may be implemented.

Figure 8B:
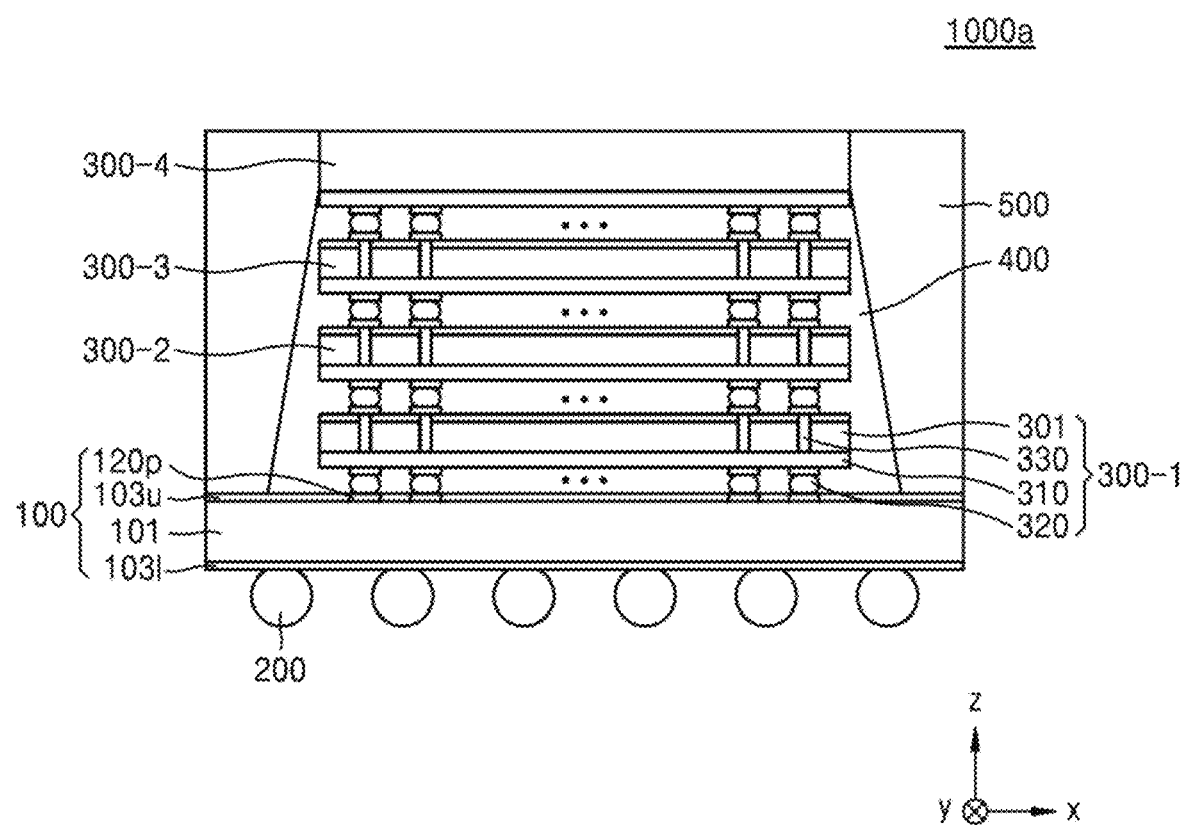

Referring to FIG. 8B, a semiconductor package 1000a may be different from the semiconductor package 1000 of FIG. 8A in that four semiconductor chips (i.e., first to fourth semiconductor chips 300-1, 300-2, 300-3, and 300-4) are stacked on the substrate 100, and the first to third semiconductor chips 300-1 to 300-3 each include a through silicon via (TSV) 330. In the semiconductor package 1000a of an example embodiment, for example, four semiconductor chips (i.e., first to fourth semiconductor chips 300-1, 300-2, 300-3, and 300-4) are stacked on the substrate 100, but the number of semiconductor chips stacked on the substrate 100 is not limited to four. For example, two, three, or five or more semiconductor chips may also be stacked on the substrate 100.

Each of the first to fourth semiconductor chips 300-1 to 300-4 is, for example, a memory chip, and may be similar to the semiconductor chip 300 of the semiconductor package 1000 of FIG. 8A. However, the first to third semiconductor chips 300-1 to 300-3 may be different from the semiconductor chip 300 of the semiconductor package 1000 of FIG. 7A in further including the TSV 330 penetrating the chip substrate 301. The fourth semiconductor chip 300-4 may not include the TSV 330. The first to fourth semiconductor chips 300-1 to 300-4 may be electrically connected to the substrate 100 through the TSV 330 and the bump 320.

The first semiconductor chip 300-1 may be stacked on the substrate 100 through the bump 320 and the adhesive layer 400. Each of the second to fourth semiconductor chips 300-2 to 300-4 may be stacked on a corresponding semiconductor chip therebelow through the bump 320 and the adhesive layer 400. In FIG. 8B, the adhesive layer 400 is shown in an integral structure, but according to an example embodiment, an adhesive layer between the first semiconductor chip 300-1 and the substrate 100 and an adhesive layer between other two adjacent semiconductor chips may be formed to be distinct from each other. In addition, the adhesive layers may have a structure that slightly protrudes outward from a corresponding semiconductor chip, and may be completely separated from each other.

According to an example embodiment, the first to fourth semiconductor chips 300-1 to 300-4 may be mounted on the substrate 100 through wire bonding. In this case, the first to third semiconductor chips 300-1 to 300-3 may not include the TSV 330. In addition, the first to fourth semiconductor chips 300-1 to 300-4 may be stacked on the substrate 100 or a corresponding semiconductor chip therebelow through an adhesive layer so that the device layer 310 faces upward. In addition, for wire bonding, the first to fourth semiconductor chips 300-1 to 300-4 may be stacked on the substrate 100 in a zigzag structure or a stepped structure, and may be electrically connected to the substrate 100 through a wire.

As shown in FIG. 8B, an upper surface of the fourth semiconductor chip 300-4 may not be covered by the sealing member 500. However, according to an example embodiment, the upper surface of the fourth semiconductor chip 300-4 may also be completely covered by the sealing member 500.

Also, in the semiconductor package 1000a, the substrate 100 does not include power lines in the signal area SA. Accordingly, in the semiconductor package 1000a, noise due to power lines may be suppressed, and a semiconductor package with improved SI may be implemented. The semiconductor package 1000a example may correspond to an HBM package. In this case, the substrate 100 may be an interface chip, and each of the first to fourth semiconductor chips 300-1 to 300-4 may be a DRAM chip. The semiconductor package 1000a is not limited to an HBM package.

Figure 9:
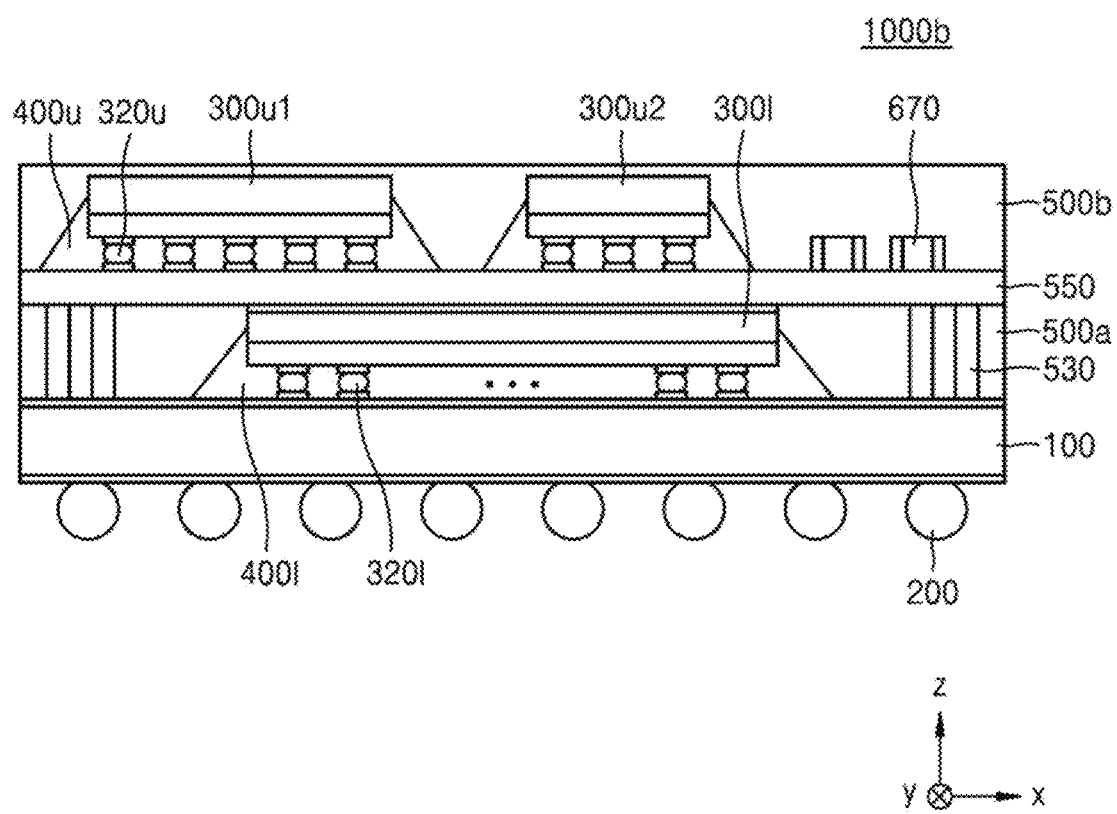

Referring to FIG. 9, a semiconductor package 1000b of an example embodiment may include the substrate 100, the external connection terminal 200, a lower semiconductor chip 300l, upper semiconductor chips 300u1 and 300u2, first and second sealing members 500a and 500b, a through electrode 530, a redistribution structure 550, and a passive device 670.

The substrate 100 may be the substrate 100 of FIG. 1A. However, the substrate 100 is not limited to the substrate 100 of FIG. 1A. For example, the substrate 100 may be any one of substrates 100a to 100i of FIGS. 4A, 5A, 5B, 5C, 6A, 6B, 6C, 7A and to 7B. The external connection terminal 200 may be arranged on a lower surface of the substrate 100. For reference, a structure in which external connection terminals are widely arranged beyond a lower surface of a corresponding semiconductor chip is referred to as a fan-out (FO) structure. In addition, a semiconductor package including a substrate having an FO structure based on a wafer is referred to as an FO wafer level package (FOWLP), and a semiconductor package including a package substrate having an FO structure based on a panel is referred to as an FO panel level package (FOPLP). In the semiconductor package 1000b, the body layer 101 of the substrate 100 may be formed based on a wafer. Accordingly, the semiconductor package 1000b may correspond to an FOWLP.

The lower semiconductor chip 300l may be mounted on the substrate 100 through a bump 320l and an adhesive layer 400l, and may be sealed by the first sealing layer 500a. The lower semiconductor chip 300l may include a logic semiconductor chip and/or a memory semiconductor chip. For example, the logic semiconductor chip may include an application processor (AP), a microprocessor, a central processing unit (CPU), a controller, or an application specific integrated circuit (ASIC). In addition, the memory semiconductor chip may be, for example, a volatile memory such as DRAM, SRAM, or the like, or a non-volatile memory such as a flash memory.

The through electrode 530 may be arranged in the first sealing layer 500a. After forming a through hole penetrating the first sealing layer 500a, the through electrode 530 may be formed by filling the through hole with a conductive material. However, according to an example embodiment, the through electrode 530 may be formed before the first sealing layer 500a, and the first sealing layer 500a may then be formed to surround the through electrode 530.

The redistribution structure 550 may be arranged on the lower semiconductor chip 300l and the first sealing layer 500a. The redistribution structure 550 may include a redistribution circuit therein. The redistribution of the redistribution structure 550 may be connected to the through electrode 530 therebelow. In the redistribution structure 550, the signal area SA may be defined, as in the substrate 100 of FIG. 1A. Accordingly, power lines may not be included in the signal area SA of the redistribution structure 550.

The upper semiconductor chips 300u1 and 300u2 and the passive device 670 may be mounted on the redistribution structure 550, and may be sealed by the second sealing member 500b. The upper semiconductor chips 300u1 and 300u2 may include a first upper semiconductor chip 300u1 and a second upper semiconductor chip 300u2. For example, the first upper semiconductor chip 300u1 and the second upper semiconductor chip 300u2 may be memory chips of different types. The upper semiconductor chips 300u1 and 300u2 may be stacked on the redistribution structure 550 through a bump 320u and an adhesive layer 400u. The upper semiconductor chips 300u1 and 300u2 and the passive device 670 may be electrically connected to the redistribution of the redistribution structure 550.

Also in the semiconductor package 1000b, the substrate 100 and/or the redistribution structure 550 does not include power lines in the signal area SA. Accordingly, in the semiconductor package 1000b, noise due to power lines may be suppressed, and a semiconductor package with improved SI may be implemented.

Figure 10:
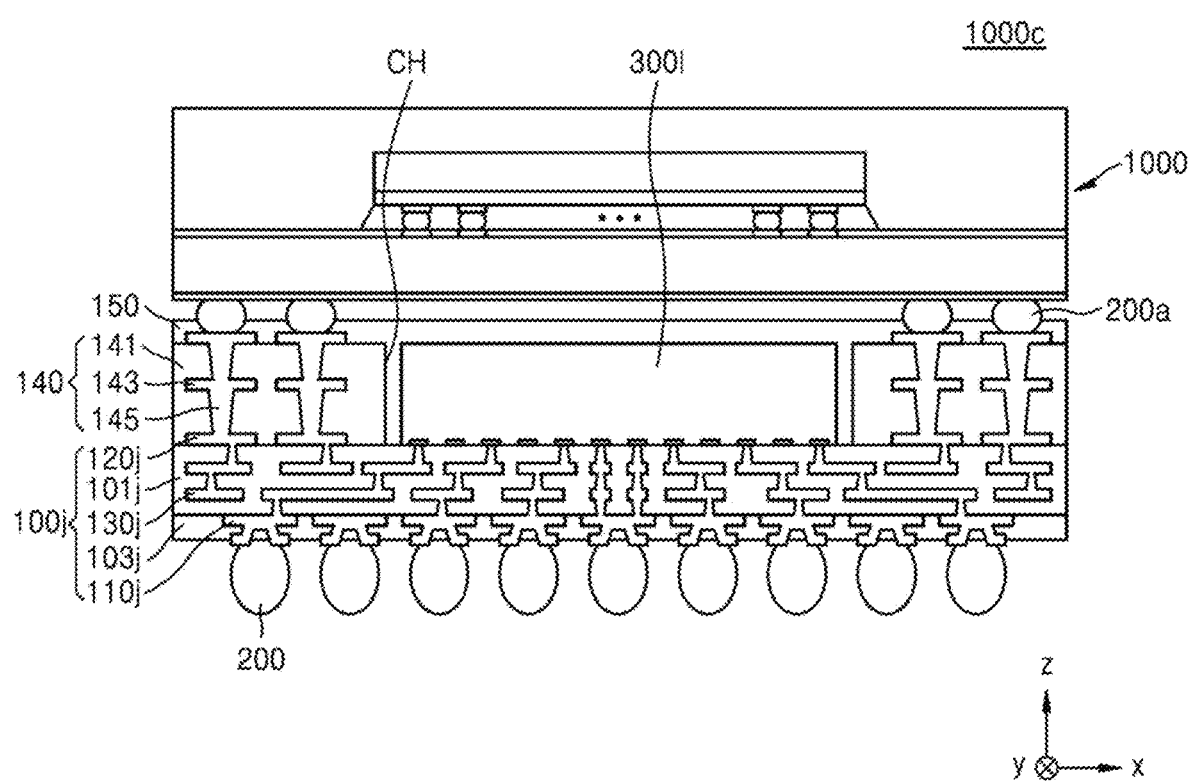

Referring to FIG. 10, a semiconductor package 1000c may include a redistribution substrate 100j, the external connection terminal 200, the lower semiconductor chip 300l, a core layer 140, a filling member 150, and an upper package 1000.

The redistribution substrate 100j may be arranged under the lower semiconductor chip 300l, and chip pads of the lower semiconductor chip 300l may be redistributed in an outer area of the lower semiconductor chip 300l. The redistribution substrate 100j may correspond to the substrate 100 of FIG. 1A. Accordingly, the redistribution substrate 100j may include a body layer 101j, a lower wiring layer 110j, an upper wiring layer 120j, and an internal wiring layer 130j, similar to the substrate 100 of FIG. 1A. The body layer 101j may be formed based on an organic material. For example, the redistribution substrate 100j may be an organic material panel. The internal wiring layer 130j may be formed in multiple layers and include redistributions. The lower wiring layer 110j may be exposed through a protective layer 103j on a lower surface of the body layer 101j.

The external connection terminal 200 may be arranged on a lower surface of the redistribution substrate 100j. The external connection terminal 200 may be electrically connected to chip pads of the lower semiconductor chip 300l through the redistribution substrate 100j. The external connection terminal 200 may be arranged on a portion corresponding to a lower surface of the lower semiconductor chip 300l and a portion extending outwardly from the lower surface in the first direction (x direction) and a second direction (y direction). The external connection terminal 200 may be widely arranged beyond the lower surface of the lower semiconductor chip 300l through the redistribution substrate 100j, and in addition, the redistribution substrate 100j is formed based on a panel, and thus a semiconductor package may correspond to a FOPLP.

The lower semiconductor chip 300l may include a logic semiconductor chip and/or a memory semiconductor chip. In the semiconductor package 1000c of an example embodiment, the lower semiconductor chip 300l may be mounted such that an active surface thereof faces the redistribution substrate 100j.

The core layer 140 may include a through hole CH penetrating upper and lower surfaces thereof, and the lower semiconductor chip 300l may be arranged in the through hole CH. The through hole CH does not completely penetrate the lower surface of the core layer 140 and may have a cavity shape. The through hole CH may be formed in a central portion of the core layer 140. However, the position of the through hole CH is not limited to the central portion.

The core layer 140 may include a core insulating layer 141, a core wiring 143, and a core via 145. The core wiring 143 may be formed in a multi-layered structure, and the multilayers thereof may be electrically connected to each other through the core via 145. In FIG. 10, the core wiring 143 is formed in a two-layered structure, but the number of layers of the core wiring 143 is not limited to two. The core insulating layer 141 may have a multi-layered structure corresponding to the multi-layered structure of the core wiring 143. In FIG. 10, the core insulating layer 141 is shown as a single layer for convenience.

The filling member 150 may fill a space in the through hole CH of the core layer 140 and extend along an upper surface of the core layer 140. In other words, the filling member 150 may fill a space between the lower semiconductor chip 300l and an inner wall of the through hole CH, and may cover an upper surface of the lower semiconductor chip 300l and an upper surface of the core layer 140. As the filling member 150 seals the lower semiconductor chip 300l arranged inside the through hole CH, the lower semiconductor chip 300*l* may be protected from external physical and chemical damage.

The upper package 1000 may be stacked on the core layer 140 and the filling member 150 through an external connection terminal 200*a*. The upper package 1000 may be, for example, the semiconductor package 1000 of FIG. 8A. However, the upper package 1000 is not limited to the semiconductor package 1000 of FIG. 8A. For example, the upper package 1000 may also be the semiconductor package 1000*a* of FIG. 8B including a plurality of semiconductor chips.

Also in the semiconductor package 1000*c*, the redistribution substrate 100*j* does not include power lines in the signal area SA. Accordingly, in the semiconductor package 1000*c*, noise due to power lines may be suppressed, and a semiconductor package with improved SI may be implemented.

Figure 11A:
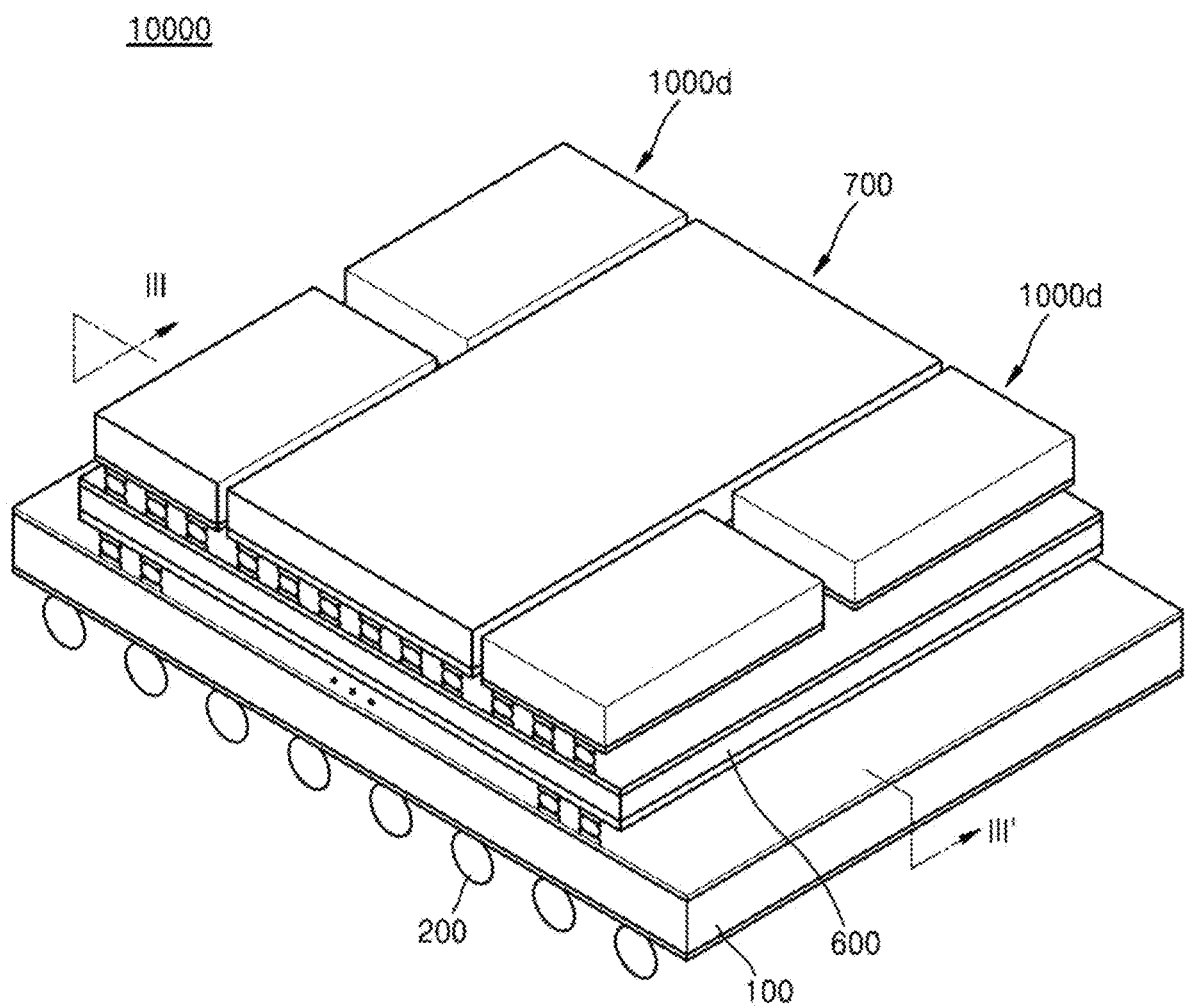
FIGS. 11A and 11B are respectively a perspective view and a cross-sectional view of a semiconductor package according to an example embodiment.
Figure 11B:
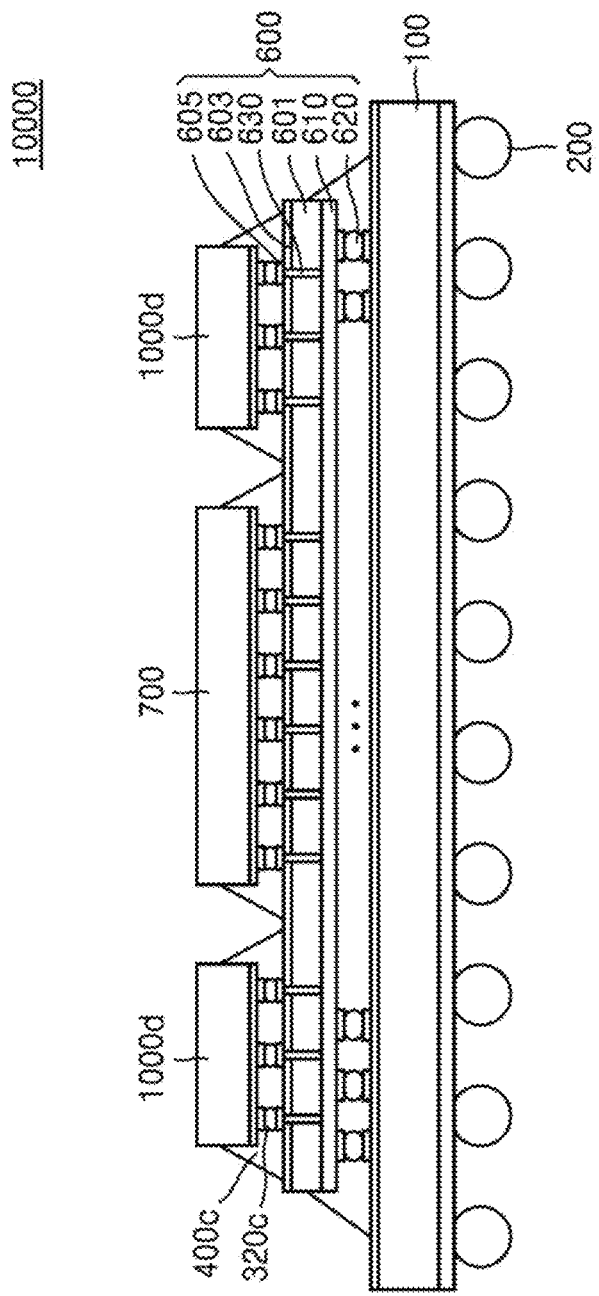

FIGS. 11A and 11B are respectively a perspective view and a cross-sectional view of a semiconductor device according to an example embodiment, wherein FIG. 11B is a cross-sectional view taken along a section III-III' of FIG. 11A. Descriptions will be made with reference to FIGS. 1A and 1B together, and those already given will be briefly described or omitted.

Referring to FIGS. 11A and 11B, a semiconductor device 10000 of an example embodiment may include a substrate 100, an external connection terminal 200, a semiconductor package 1000*d*, an interposer 600, and a processor chip 700.

The substrate 100 may be the substrate 100 of FIG. 1A. However, the substrate 100 is not limited to the substrate 100 of FIG. 1A. For example, the substrate 100 may be any one of substrates 100*a* to 100*i* of FIGS. 4A, 5A, 5B, 5C, 6A, 6B, 6C, 7A and 7B. The external connection terminal 200 may be arranged on a lower surface of the substrate 100. The semiconductor device 10000 may be mounted on other external board such as a system board or a mother board through the external connection terminal 200.

The semiconductor package 1000*d* may be the semiconductor package 1000*a* of FIG. 8B. However, in the semiconductor device 10000, the semiconductor package 1000*d* is not limited to the semiconductor package 1000*a* of FIG. 8B. For example, the semiconductor package 1000*d* may be any one of semiconductor packages 1000, 1000*b*, and 1000*c* of FIGS. 8A, 9, and 10. In the semiconductor device 10000, four semiconductor packages 1000*d* are mounted on the interposer 600, but the number of semiconductor packages 1000*d* is not limited to four. For example, one, two three, five or more semiconductor packages 1000*d* may be mounted on the interposer 600.

The interposer 600 may include an interposer substrate 601, an upper protective layer 603, an upper pad 605, a wiring layer 610, a bump 620, and a through electrode 630. The semiconductor package 1000*d* and the processor chip 700 may be mounted on the substrate 100 via the interposer 600. The interposer 600 may electrically connect the semiconductor package 1000*d* and the processor chip 700 to the substrate 100.

The interposer substrate 601 may include, for example, one of silicon, an organic material, plastic, and a glass substrate. However, the material of the interposer substrate 601 is not limited to the above-stated materials. When the interposer substrate 601 is a silicon substrate, the interposer substrate 601 may be referred to as a silicon interposer. In addition, when the interposer substrate 601 is an organic material substrate, the interposer substrate 601 may be referred to as a panel interposer.

The upper protective layer 603 may be arranged on the interposer substrate 601, and the upper pad 605 may be arranged on the upper protective layer 603. The upper pad 605 may be connected to the through electrode 630. The semiconductor package 1000*d* and the processor chip 700 may be stacked on the interposer 600 through bumps 320*c* arranged on the upper pad 605. The wiring layer 610 may be arranged on a lower surface of the interposer substrate 601, and may have a single-layered or multi-layered structure.

The through electrode 630 may extend by penetrating the interposer substrate 601. In addition, the through electrode 630 may extend into the wiring layer 610 to be electrically connected to wirings of the wiring layer 610. When the interposer substrate 601 includes silicon, the through electrode 630 may be referred to as a TSV. According to an example embodiment, the interposer 600 may include only a wiring layer therein and may not include a through electrode.

In the semiconductor device 10000, the interposer 600 may be used to conduct or transmit electrical signals between the substrate 100 and the semiconductor package 1000*d* or the processor chip 700. Therefore, the interposer 600 may not include devices such as an active device or a passive device. In the interposer 600, the wiring layer 610 is arranged under the through electrode 630, but the wiring layer 610 may also arranged on the through electrode 630 according to an example embodiment. For example, a positional relationship between the wiring layer 610 and the through electrode 630 may be relative.

The bump 620 may be arranged on the lower surface of the interposer 600 and electrically connected to the wirings of the wiring layer 610. The interposer 600 may be mounted on the substrate 100 through the bump 620. The bump 620 may be connected to the upper pad 605 through the wirings of the wiring layer 610 and the through electrode 630.

In the semiconductor device 10000, in the interposer 600, the signal area SA may be defined, as in the substrate 100 of FIG. 1A. Accordingly, power lines may not be included in the signal area SA of the interposer 600. For example, the upper pad 605 of the interposer 600 may correspond to the pins 120*p* of the substrate 100 of FIG. 1A, and the wiring layer 610 of the interposer 600 may correspond to the lower wiring layer 110 and/or the internal wiring layer 130 of the substrate 100 of FIG. 1A.

The processor chip 700 may be a graphics processing unit (GPU)/CPU/system on chip (SOC). According to the types of devices included in the processor chip 700, the semiconductor device 10000 may be classified into a server-oriented semiconductor device or a mobile-oriented semiconductor device.

The semiconductor device 10000 may include an internal sealing member sealing the semiconductor package 1000*d* and the processor chip 700 on the interposer 600. In addition, the semiconductor device 10000 may include an external sealing member sealing the interposer 600 and the internal sealing member on the substrate 100. According to an example embodiment, the external sealing member and the internal sealing member may be formed together and thus indistinguishable. In addition, according to an example embodiment, the internal sealing member may cover only an upper surface of the processor chip 700 and may not cover an upper surface of the semiconductor package 1000*d*.

For reference, a structure of the semiconductor device 10000 is referred to as 2.5D package structure, and the 2.5D package structure may be a relative concept to a three-dimensional (3D) package structure without an interposer. Both the 2.5D package structure and the 3D package structure may be included in a system in package (SIP) structure. The semiconductor device 10000 may also be a type of semiconductor package. However, because the semiconductor device 10000 may include the semiconductor package 1000*d* corresponding to the semiconductor packages 1000, and 1000*a* to 1000*c* of FIGS. 8A to 10, the semiconductor device 10000 may be referred to as a semiconductor device to be terminologically distinguished from the semiconductor package 1000*d*. Hereinafter, the same concept may also applied to a semiconductor device 10000*a* of FIG. 12.

Also in the semiconductor device 10000, the substrate 100 and/or the interposer 600 does not include power lines in the signal area SA. Accordingly, in the semiconductor device 10000, noise due to power lines may be suppressed, and a semiconductor device with improved SI may be implemented.

Figure 12:
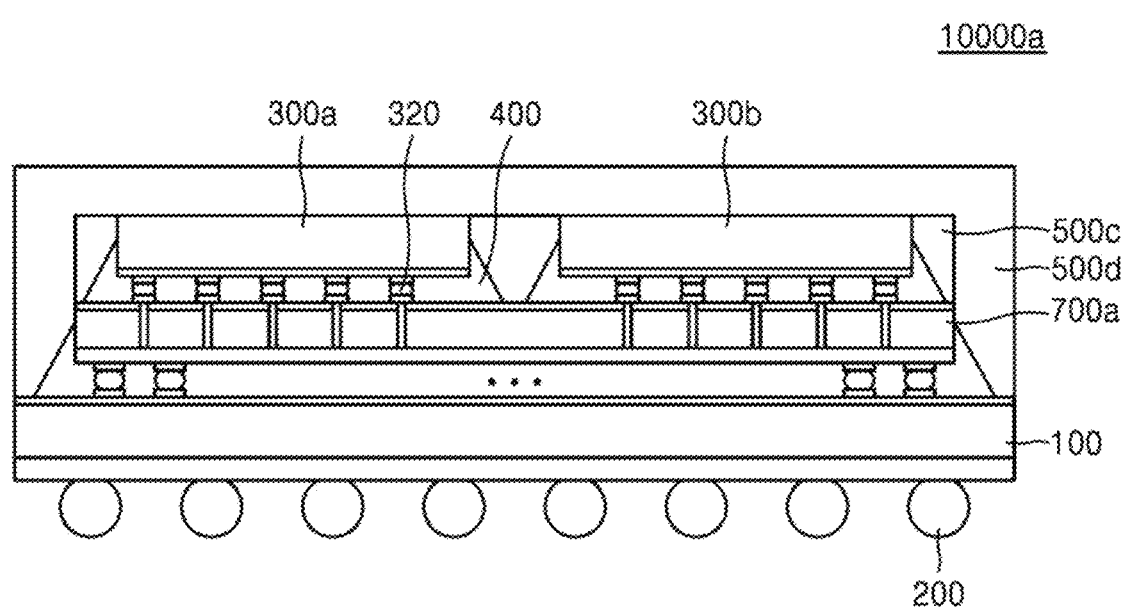
FIG. 12 is a cross-sectional view of a semiconductor device, according to an example embodiment.

FIG. 12 is a cross-sectional view of the semiconductor device 10000*a*, according to an example embodiment. Descriptions will be made with reference to FIGS. 1A and 1B together, and those already given will be briefly described or omitted.

Referring to FIG. 12, the semiconductor device 10000*a* may include the substrate 100, the external connection terminal 200, memory chips 300*a* and 300*b*, a logic chip 700*a*, an internal sealing member 500*c*, and an external sealing member 500*d*.

The substrate 100 may be the substrate 100 of FIG. 1A. However, the substrate 100 is not limited to the substrate 100 of FIG. 1A. For example, the substrate 100 may be any one of substrates 100*a* to 100*i* of FIGS. 4A, 5A, 5B, 5C, 6A, 6B, 6C, 7A and 7B. The external connection terminal 200 may be arranged on a lower surface of the substrate 100. The semiconductor device 10000 may be mounted other external board such as a system board or a mother board through the external connection terminal 200.

Two memory chips 300*a* and 300*b* may be mounted on the logic chip 700*a*. The two memory chips 300*a* and 300*b* may be the same memory chips. For example, both of the two memory chips 300*a* and 300*b* may be SRAM chips. However, according to an example embodiment, the two memory chips 300*a* and 300*b* may be memory chips different from each other. For example, a first memory chip 300*a* may be an SRAM chip, and a second memory chip 300*b* may be a DRAM chip.

The number of memory chips stacked on the logic chip 700*a* is not limited to two. For example, one, two, three or more memory chips may be stacked on the logic chip 700*a*. In addition, types of the memory chips are not limited to SRAM chips or DRAM chips. For example, the various types of memory chips described above may be included in the semiconductor device 10000*a*. In addition, a memory package may also be mounted on the logic chip 700*a* instead of the two memory chips 300*a* and 300*b*. The memory package may include at least two memory chips. In addition, three or more memory packages may also be mounted on the logic chip 700*a*.

The logic chip 700*a* may be mounted on the substrate 100. The logic chip 700*a* may be various types of processor chips, such as a GPU/CPU/SOC or the like. The internal sealing member 500*c* may seal the memory chips 300*a* and 300*b* on the logic chip 700*a*. In addition, the external sealing member 500*d* may seal the logic chip 700*a* and the internal sealing member 500*c* on the substrate 100. Because the logic chip 700*a* is stacked on the substrate 100 and the memory chips 300*a* and 300*b* are stacked on the logic chip 700*a*, the semiconductor device 10000*a* may correspond to a 3D package structure.

Also in the semiconductor device 10000*a*, the substrate 100 does not include power lines in the signal area SA. Accordingly, in the semiconductor device 10000*a*, noise due to power lines may be suppressed, and a semiconductor device with improved SI may be implemented.

While aspects of example embodiments have been particularly shown and described, it will be understood that various changes in form and details may be made therein without departing from the spirit and scope of the following claims.

What is claimed is:

1. A substrate comprising:
a body layer comprising a signal area;
a first wiring layer provided on a lower surface of the body layer, the first wiring layer comprising a plurality of first signal lines provided in the signal area and a first power line provided outside the signal area; and
a second wiring layer provided on an upper surface of the body layer, the second wiring layer comprising a plurality of second signal lines provided in the signal area and a second power line provided outside the signal area.

2. The substrate of claim 1, wherein a group of signal lines from among the plurality of first signal lines and the plurality of second signal lines having substantially a same operating speed and function form a signal group,
the signal area corresponds to a continuous area comprising outermost signal lines among the group of signal lines in a horizontal direction parallel to the upper surface and a vertical direction perpendicular to the upper surface, and
the first power line and the second power line are not arranged in the signal area.

3. The substrate of claim 2, wherein each of the first wiring layer and the second wiring layer comprises a ground line provided in the signal area.

4. The substrate of claim 1, wherein each of the first wiring layer and the second wiring layer comprises a ground line provided in the signal area,
each of the first wiring layer and the second wiring layer comprises signal pins, power pins, and ground pins,
the plurality of first signal lines and the plurality of second signal lines provide connections between the signal pins and pass through the signal area, and
the first power line and the second power line provide connections between the power pins and are routed around the signal area.

5. The substrate of claim 1, further comprising an internal wiring layer provided inside the body layer between the first wiring layer and the second wiring layer.

6. The substrate of claim 5, wherein the internal wiring layer comprises at least one ground plane.

7. The substrate of claim 5, wherein a group of signal lines from among the plurality of first signal lines and the plurality of second signal lines form a signal group,
the signal area is defined as an area including outermost signal lines among the group of signal lines in a horizontal direction parallel to the upper surface and a vertical direction perpendicular to the upper surface,
the internal wiring layer has a multi-layered structure, and
the signal area comprises a first signal area and a second signal area provided on different sides of the internal wiring layer.

8. The substrate of claim 7, wherein the internal wiring layer comprises a ground plane separating the first signal area and the second signal area from each other in the horizontal direction.

9. A substrate comprising:
a body layer comprising a signal area;
a first wiring layer provided on a lower surface of the body layer, the first wiring layer comprising a plurality of first signal lines provided in the signal area and a first power line provided outside the signal area;
a second wiring layer provided on an upper surface of the body layer, the second wiring layer comprising a plurality of second signal lines provided in the signal area and a second power line provided outside the signal area; and
an internal wiring layer provided inside the body layer between the first wiring layer and the second wiring layer,
wherein a group of signal lines from among the plurality of first signal lines and the plurality of second signal lines having substantially a same operating speed and function form a signal group, and the signal area corresponds to an area comprising outermost signal lines among the plurality of first signal lines and the plurality of second signal lines forming the signal group in a horizontal direction parallel to the upper surface and a vertical direction perpendicular to the upper surface.

10. The substrate of claim 9, wherein each of the first wiring layer, the second wiring layer, and the internal wiring layer comprises a ground line provided in the signal area.

11. The substrate of claim 10, wherein each of the first wiring layer and the second wiring layer comprises signal pins, power pins, and ground pins,
the plurality of first signal lines and the plurality of second signal lines provide connections between the signal pins and pass through the signal area, and
the first power line and the second power line provide connections between the power pins and are routed around the signal area.

12. The substrate of claim 9, wherein the internal wiring layer comprises at least one ground plane.

13. A semiconductor package comprising:
a substrate comprising:
a body layer comprising a signal area;
a first wiring layer provided on a lower surface of the body layer, the first wiring layer comprising a plurality of first signal lines provided in the signal area and a first power line provided outside the signal area; and
a second wiring layer provided on an upper surface of the body layer, the second wiring layer comprising a plurality of second signal lines provided in the signal area and a second power line provided outside the signal area;
at least one semiconductor chip mounted on the substrate; and
a sealing member sealing the at least one semiconductor chip on the substrate.

14. The semiconductor package of claim 13, wherein a group of signal lines from among the plurality of first signal lines and the plurality of second signal lines having substantially a same operating speed and function form a signal group,
the signal area corresponds to a continuous an area comprising outermost signal lines among the group of signal lines in a horizontal direction parallel to the upper surface and a vertical direction perpendicular to the upper surface, and
the first power line and the second power line are not arranged in the signal area.

15. The semiconductor package of claim 14, wherein each of the first wiring layer and the second wiring layer comprises signal pins, power pins, and ground pins,
the plurality of first signal lines and the plurality of second signal lines provide connections between the signal pins and pass through the signal area, and
the first power line and the second power line bypass the signal area to connect the power pins.

16. The semiconductor package of claim 13, further comprising an internal wiring layer provided inside the body layer between the first wiring layer and the second wiring layer,
wherein the internal wiring layer comprises at least one ground plane.

17. The semiconductor package of claim 13, wherein the semiconductor package corresponds to a wafer level package in which the substrate is formed based on a wafer, or a panel level package in which the substrate is formed based on a panel.

18. The semiconductor package of claim 13, wherein the semiconductor package has a 2.5D structure,
the substrate comprises a base substrate and an interposer provided on the base substrate,
the at least one semiconductor chip comprises a logic chip and a memory chip, and
the logic chip and the memory chip are arranged adjacent to each other on the interposer.

19. The semiconductor package of claim 18, wherein the memory chip is a dynamic random access memory (DRAM) chip and is included in a high bandwidth memory (HBM) package, and
the HBM package comprises a buffer chip at a bottom and a plurality of DRAM chips on the buffer chip.

20. The semiconductor package of claim 13, wherein the semiconductor package has a three-dimensional (3D) structure, and
the at least one semiconductor chip comprises a logic chip provided on the substrate, and a memory chip provided on the logic chip.

* * * * *